United States Patent
Frangen

(10) Patent No.: US 11,146,160 B2
(45) Date of Patent: Oct. 12, 2021

(54) TRANSPORTING DEVICE WITH A STATOR FOR THE CONTROLLED TRANSPORT OF A TRANSPORT ELEMENT RELATIVE TO THE STATOR

(71) Applicant: Robert Bosch GmbH, Stuttgart (DE)

(72) Inventor: Joachim Frangen, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/468,949

(22) PCT Filed: Nov. 14, 2017

(86) PCT No.: PCT/EP2017/079112
§ 371 (c)(1),
(2) Date: Jun. 12, 2019

(87) PCT Pub. No.: WO2018/108408
PCT Pub. Date: Jun. 21, 2018

(65) Prior Publication Data
US 2019/0348898 A1    Nov. 14, 2019

(30) Foreign Application Priority Data

Dec. 14, 2016   (DE) ..................... 10 2016 224 951.7

(51) Int. Cl.
*H02P 6/16*      (2016.01)
*H02K 41/03*    (2006.01)
(Continued)

(52) U.S. Cl.
CPC ........... *H02K 41/033* (2013.01); *B65G 54/02* (2013.01); *H02K 11/21* (2016.01); *H02N 15/00* (2013.01);
(Continued)

(58) Field of Classification Search
CPC ........... B60L 13/04; B60L 13/06; B60L 13/08
See application file for complete search history.

(56) References Cited

U.S. PATENT DOCUMENTS 4,934,279 A * 6/1990 Azukizawa ............. B60L 13/08
                                                      104/130.02
5,601,029 A * 2/1997 Geraghty ................ B60L 13/08
                                                      104/284
(Continued)

FOREIGN PATENT DOCUMENTS

| CA | 2 905 783 A1 | 9/2014 |
|---|---|---|
| DE | 199 60 321 A1 | 7/2001 |

(Continued)

OTHER PUBLICATIONS

International Search Report corresponding to PCT Application No. PCT/EP2017/079112, dated Feb. 5, 2018 (German and English language document) (5 pages).
German Search Report corresponding to German Patent Application No. 10 2016 224 951.7, dated Sep. 21, 2017) (14 pages).

*Primary Examiner* — Rina I Duda
(74) *Attorney, Agent, or Firm* — Maginot, Moore & Beck LLC

(57) ABSTRACT

A transport device has a stator and at least one transport element. The transport device is designed to transport the transport element in a controlled manner relative to the stator, and the stator or the transport element has multiple movable actuating magnets, each of which is connected to the stator or transport element via an actuating element. The actuating element is designed to change the position and/or orientation of the connected actuating magnet relative to the stator or transport element in a controlled manner. The respective other part has at least two stationary magnets fixedly connected to the respective other part. The stator and the transport element are magnetically coupled by means of the stationary magnets and actuating magnets, and the (Continued)

transport device is designed to transport the transport element relative to the stator by the control positioning and/or orientation of the actuating magnets by means of the actuating magnets.

20 Claims, 25 Drawing Sheets

(51) Int. Cl.
    *H02K 11/21*     (2016.01)
    *H02P 25/064*     (2016.01)
    *B65G 54/02*     (2006.01)
    *H02N 15/00*     (2006.01)
    *H02P 6/00*     (2016.01)
    *B60L 13/06*     (2006.01)

(52) U.S. Cl.
    CPC ............... *H02P 6/006* (2013.01); *H02P 6/16* (2013.01); *H02P 25/064* (2016.02); *B60L 13/06* (2013.01); *H02K 2201/18* (2013.01)

(56) References Cited

U.S. PATENT DOCUMENTS

| | | | |
|---|---|---|---|
| 7,448,327 B2* | 11/2008 | Thornton | ................ B60L 13/06 104/282 |
| 8,803,646 B2 | 8/2014 | Farber | |
| 2003/0217668 A1* | 11/2003 | Fiske | ...................... B60L 13/04 104/282 |
| 2005/0077793 A1* | 4/2005 | Garvey | ............... F16C 32/0444 310/90.5 |
| 2010/0186618 A1* | 7/2010 | King | .................... H02K 41/031 104/281 |
| 2014/0265690 A1 | 9/2014 | Henderson | |

FOREIGN PATENT DOCUMENTS

| | | |
|---|---|---|
| JP | 49-13581 Y1 | 4/1974 |
| JP | 8-111313 A | 4/1996 |
| WO | 2015/017933 A1 | 2/2015 |

* cited by examiner

TRANSPORTING DEVICE WITH A STATOR FOR THE CONTROLLED TRANSPORT OF A TRANSPORT ELEMENT RELATIVE TO THE STATOR

This application is a 35 U.S.C. § 371 National Stage Application of PCT/EP2017/079112, filed on Nov. 14, 2017, which claims the benefit of priority to Serial No. DE 10 2016 224 951.7, filed on Dec. 14, 2016 in Germany, the disclosures of which are incorporated herein by reference in their entirety.

The present disclosure relates to conveying devices having a stator for the controlled conveyance of a transport body relative to the stator, and to a method for operating the same. The disclosure may preferably be used in the context of magnetic levitation for the floating transport and for the positioning and/or orientation of objects. Here, the disclosure may preferably be used in the field of technical manufacture, in mechanical and plant engineering, in logistics, or in passenger conveyance.

BACKGROUND

In the context of technical manufacture, it is often necessary for objects such as materials, workpieces, tools or products to be transported or positioned. For this purpose, use is conventionally made of contact-type systems, which are in direct mechanical contact with the objects to be conveyed, such as for example belts, clock feeds, indexing tables or mobile robots for transporting workpieces, axis systems or industrial robots for the positioning of workpieces or tools, special devices for machining and inspection processes.

Contactless conveying systems are also known which are used for example in mechanical engineering and plant engineering, for example for transporting goods in packaging machines, for the positioning of machine elements or for the most precise possible orientation of tools with respect to the workpiece, for example for laser machining, or in the semiconductor industry for the exposure of substrates in wafer steppers. Here, systems for levitating objects may be used.

One challenge in the case of magnetic levitation consists in establishing a structure which floats in a stable manner in a magnetic field. A further challenge consists in positioning and/or moving the floating structure automatically in all six degrees of freedom (in each case three in translation and in rotation) in accordance with a setpoint specification, which is also referred to as full magnetic levitation.

For this purpose, simplified systems may be used in which one or more degrees of freedom of a magnetically levitating structure are guided with mechanical contact, for example by means of a mechanical support bearing, such that only five or fewer degrees of freedom have to be magnetically controlled. This thus does not constitute full magnetic levitation.

Another system is disclosed in U.S. Pat. No. 8,803,646 A. Here, a magnetic gyroscope is held in a floating state by virtue of one degree of freedom, specifically the axis of rotation of the gyroscope, being stabilized in contactless fashion not by magnetic forces but rather by inertial forces. This, too, does not constitute full magnetic levitation.

Furthermore, the document CA 2 905 783 A discloses an arrangement composed of rotating permanent magnets in a platform over a conductive substrate. The platform is subjected, on the conductive substrate, to a lift force, because the rotating magnets give rise to eddy currents in the conductive substrate, the magnetic field of which in turn repels the permanent magnets. Here, several degrees of freedom are not controlled, for which reason this, too, does not constitute full magnetic levitation.

Planer motors with air bearings are also possible. Here, transport bodies are moved contactlessly over a stator. The levitation is realized by means of an equilibrium between attracting and repelling forces, wherein the attraction is based on magnetic forces between electromagnetic coils in the transport body and a structured ferromagnetic plate in the stator, whereas the repulsion is normally generated by means of a pneumatic air bearing, for example by means of an air cushion between transport body and stator. The levitation spacing is typically considerably less than 1 mm, and the movement is normally restricted to one plane and thus to fewer than six degrees of freedom. Furthermore, the transport bodies are often electrically wired to the stator, such that, owing to the feed line, the freedom of movement may be greatly restricted, in particular in the case of multiple transport bodies being present on the stator. Since an air bearing is used and not all six degrees of freedom of the transport body are positionable, this system, too, does not provide full magnetic levitation.

Magnetically levitating systems with six degrees of freedom and transport bodies without cable attachment are known for example from the document WO 2015/017933 A. Such systems are often based on the magnetic repulsion of a transport body, which is equipped with permanent magnets, in the field of a stator, which is equipped with numerous ironless, electromagnetic coils. The position of the transport body is acquired by sensors and controlled in closed-loop fashion through variation of the coil currents. Such systems permit full magnetic levitation, but they exhibit only limited suitability for many applications. In particular, such systems often have greatly restricted ranges of movement in some degrees of freedom, in particular in the dimension perpendicular to the stator plane or active surface or conveying surface, such that, for example, a Z movement, pitching and/or rolling are possible only to a very limited extent.

Furthermore, in conventional systems, an electrical failure is often critical because the transport body, if it is operated on a wall or ceiling, may fall down in uncontrolled fashion and, in so doing, cause damage. Special solutions for avoiding this problem are duly known, but give rise to disadvantages in terms of costs, weight and performance.

It is therefore desirable to provide a conveying device which permits reliable and efficient operation for the conveyance of a transport body with three translational and three rotational degrees of freedom.

Summary

According to the disclosure, conveying devices having a stator for the controlled conveyance of a transport body relative to the stator, and a method for operating the same, having the features disclosed herein are proposed. Advantageous refinements are also the subject of the following description.

The disclosed device permits controlled conveyance of a transport body relative to a stator by virtue of one of the two elements having a multiplicity of at least partially movably arranged actuating magnets, the respective position and/or orientation of which relative to said element can be predefined in a controlled manner by means of actuating elements, and the other of the two elements having at least two static magnets which are connected immovably to said element, wherein the static magnets are magnetically coupled to actuating magnets. The conveying device is configured to convey the transport body relative to the stator by means of controlled positioning and/or orientation of actuating magnets. Here, the conveyance includes in particular moving the at least one transport body into a desired position and/or orientation relative to the stator.

The disclosed device permits full magnetic levitation of the transport body in six degrees of freedom, that is to say in three translational and three rotational degrees of freedom relative to the stator. This has the advantage that the conveyance of the transport body can be performed with greater flexibility than in the case of conventional systems, and thus more versatile usability of the conveying device is possible.

Furthermore, the disclosed device offers the advantage that levitation and/or forward movement of the transport body relative to the stator by means of corresponding positioning and/or orientation of the actuating magnets by means of the respective actuating elements are made possible. In this way, provision of a complex arrangement and activation of magnet coils can be omitted. This not only reduces the complexity of the conveying device and thus the production costs but also permits the use of permanent magnets, which can often provide a very much greater flux density than magnet coils that can be used for such purposes. This can in turn permit a greater lift height or a larger air gap between the stator and the transport body, which can result in an increased movement clearance in the case of movements in a Z direction and/or in the pitch and roll angle ranges. Furthermore, this offers the advantage that an interruption in the supply of electrical energy also does not inevitably have to lead to a malfunction or even cause damage. In particular, an interruption in the power supply does not lead to a loss of the magnetic field or of the magnetic coupling between stator and transport body. For example, in the event of an interruption of the power supply, the coupling forces between the actuating magnets and the static magnets may increase as soon as the position and/or the orientation of the actuating magnets yields to the attracting force action of the static magnets, whereupon the transport body is pulled onto the stator and is thus secured against falling down in an uncontrolled manner. Furthermore, the disclosed device offers the advantage that the magnetic coupling between the stator and the transport body can effect both levitation of the transport body, that is to say a lifting movement relative to the stator, and locomotion of the transport body relative to the stator, that is to say conveyance, without yet further contact-type or contactless systems being imperatively necessary for this purpose. In this way, contactless transport can be made possible, such that a conveying device according to the disclosure can be used even in environments with increased cleanliness requirements. For example, the transport body can be conveyed in an environment with increased cleanliness requirements, whereas the stator is arranged outside in an environment with relatively low cleanliness requirements. For example, separating elements may run through an air gap between the stator and the transport body in order to separate the regions of different cleanliness. Thus, the disclosed device is also suitable for use in biological, chemical and/or pharmaceutical processes, and for example in gas-tight, liquid-tight and/or encapsulated regions.

Furthermore, the disclosed device offers the advantage that magnet coils do not imperatively have to be provided either in the transport body or in the stator, such that heating of the transport body and/or of the stator by currents flowing through such coils can be avoided. This promotes use of the disclosed device in heat-critical environments or for the conveyance of heat-sensitive objects, and improves the energy efficiency of the conveying device, because the dissipation of electrical energy can be reduced.

Owing to the levitation or conveyance by means of magnetic coupling, it is also possible for a decoupling of the transport body or of the conveying device from oscillations and/or vibrations and/or structure-borne sound waves to be achieved in an efficient manner, whereby the disclosed device can be used even for the conveyance of sensitive objects and/or persons.

The conveying device preferably has a multiplicity of actuating magnets and/or a multiplicity of static magnets. It is particularly preferable if the actuating magnets and/or the static magnets are arranged above a conveying surface in or on the stator or in or on the transport body, such that the transport body can be levitated and/or conveyed along the conveying surface. In this way, it is possible to generate a larger region in which the transport body can be conveyed. It is particularly preferable if the actuating magnets have, overall, a number of degrees of freedom which is at least as great as the number of degrees of freedom of the transport body in which the transport body is to be conveyed and/or positioned in controlled fashion. For example, if the transport body is to be conveyed and/or positioned in six degrees of freedom, it is advantageous to provide multiple actuating magnets which have a total of six or more degrees of freedom. For example, for this purpose, the actuating magnets may be configured such that the transport body interacts with at least six actuating magnets at all times.

It is preferable if the magnetic field of the actuating magnets and/or the magnetic field of the at least two static magnets faces toward the conveying surface, that is to say a magnetic pole faces toward the conveying surface. Here, the conveying surface is the surface along which the transport body is conveyed relative to the stator in controlled fashion. In particular, the conveying surface may coincide with a stator plane and/or an active surface of the stator. For example, a surface lying between the stator and a transport body levitated by the stator may constitute the conveying surface. Such an arrangement offers the advantage that the magnetic coupling between the actuating magnets and the static magnets can be increased or optimized. Preferably, the magnetic poles of the actuating magnets and static magnets face toward one another or are arranged such that the magnetic fields thereof have an overlap and/or interact. It is preferable here if the magnetic fields in directions averted from the conveying surface are minimized.

It is preferable if the at least two static magnets and/or the actuating magnets have in each case at least one permanent magnet. This has the advantage that, in the stator and/or in the transport body, the use of magnet coils can be reduced or even eliminated entirely, and thus the energy consumption of the conveying device can be lowered. Furthermore, by means of permanent magnets, a very strong magnetic field can be generated in relation to magnet coils, which magnetic field can furthermore be provided in a small space. Also, with the use of permanent magnets for providing the magnetic field, no supply of electrical power to the magnets is necessary, such as is the case for example if magnet coils are used. Furthermore, permanent magnets do not dissipate any electrical power, and thus do not contribute to undesired heating of the conveying device. It is particularly preferable if a static magnet and/or an actuating magnet has exclusively one or more permanent magnets without additionally having magnet coils. In this way, it is for example possible to avoid the need for the transport body to be contacted with a feed line for electrical energy, which impedes the locomotion.

It is preferable if a permanent magnet (at one point of the surface) provides a magnetic flux density of at least 0.05 T, preferably at least 0.1 T, more preferably at least 0.25 T, even more preferably at least 0.5 T, particularly preferably at least 0.75 T, most preferably at least 1 T. In particular, permanent magnets can be selected such that, by means of the selected flux densities, the forces and moments required for the transport and/or for the positioning of the transport body can be attained. Permanent magnets with a relatively high flux density can for example serve for effecting a greater lifting movement and/or effecting more intense accelerations and/or conveying heavier loads by means of the transport body.

Preferably, an actuating magnet has a magnet group which preferably has multiple permanent magnets and/or magnet coils. The static magnets preferably also form at least one magnet group, wherein the magnet group preferably has multiple permanent magnets and/or magnet coils. In particular if the multiple magnets of a magnet group are arranged along a straight line, it may be advantageous for the magnets to be arranged such that the multiple magnets are oriented or arranged such that their magnetic dipoles are not oriented parallel, or do not point in the same direction, in particular are not all oriented parallel to the straight line. A non-parallel arrangement of the dipoles may in this case be advantageous for a controlled conveyance or movement of the transport body in all six degrees of freedom.

It is particularly preferable if the multiplicity of permanent magnets and/or magnet coils of the at least one magnet group are at least partially arranged in a Halbach array. This offers the advantage that the magnetic fields generated by the multiple magnets are intensified in one direction leading away from the Halbach array and are reduced, or even cancel one another out entirely, in another direction leading away from the Halbach array. This may for example be advantageous in that the magnetic fields can be intensified in a direction between the stator and the transport body, whereas the magnetic fields in other directions are reduced or even cancel one another out entirely. Thus, the magnetic field can be utilized for levitation in a particularly efficient manner, and/or the magnets which have a Halbach array can be arranged adjacent to one another, in particular in a small space, without adversely affecting one another. Preferably, the Halbach arrays are arranged such that a magnetic field of the magnet assembly extends preferably toward the conveying surface or active surface. In particular, by means of the arrangement as a Halbach array, for the same coupling forces and moments, the overall weight and/or the moment of inertia of the magnets can be reduced. Most preferable are areal arrangements of magnets which form Halbach arrays in different spatial directions, in order to transmit high forces and moments in all degrees of freedom.

The actuating element preferably has a drive element which is configured to vary the position and/or the orientation of the actuating magnet connected thereto in a controlled manner. For example, such a drive element may have an electric motor which is connected directly or via a gearing and/or a linkage to the actuating magnet in order to move the latter. Furthermore, a drive element may be configured such that the multiple actuating magnets can be moved by means thereof. Such arrangements have the advantage that the actuating magnets connected to an actuating element can be varied in terms of their position or orientation individually. For example, the actuating element may be configured such that it can rotate the one or more actuating magnets about an axis and/or a center of gravity of the actuating magnet.

Furthermore, a drive element may be configured such that more than one degree of freedom of the at least one actuating magnet can be moved by means thereof. It is furthermore preferable if the actuating element has a sensor element which is configured to ascertain the position and/or the orientation of the actuating magnet connected to the actuating element. This makes it possible for the orientation and/or position of the actuating magnet to be controlled in closed-loop fashion and for the desired effect to be realized by means of the actuating magnet in an efficient and effective manner. It is furthermore preferable if the actuating magnet has a control element which is configured to set the position and/or orientation of the actuating magnet connected to the actuating element to a predetermined value by means of the drive. For example, the control element may have an open-loop and/or closed-loop control unit by means of which the movement of the actuating magnet is controlled in open-loop and/or closed-loop fashion by means of the drive element. In this way, the positioning and/or orientation of the actuating magnet can be performed particularly quickly and/or accurately.

Furthermore, a conveying device may also have a position determination unit which is configured to ascertain a relative position and/or orientation of the at least one transport body relative to the stator. For example, the position determination unit may have optical sensors and/or capacitive sensors and/or magnetic field sensors, such as for example Hall sensors, which at least partially ascertain a position and/or orientation of the transport body relative to the stator on the basis of the magnetic field caused by a transport body.

Further advantages and refinements of the disclosed device will emerge from the description and from the appended drawing.

It is self-evident that the features mentioned above and the features yet to be discussed below may be used not only in the respectively specified combination but also in other combinations or individually without departing from the present disclosure.

The disclosure is schematically illustrated in the drawings on the basis of exemplary embodiments, and will hereinafter be described in detail with reference to the drawings, but without being restricted to the exemplary embodiments shown.

Here, identical or similar elements are denoted by the same reference designations. For the sake of conciseness, corresponding explanations will not be repeated.

BRIEF DESCRIPTION OF THE DRAWINGS

FIGS. 3A to 3M show different arrangements of static magnets or of magnet groups in a plan view in a schematic illustration.

DETAILED DESCRIPTION

Figure 1A:
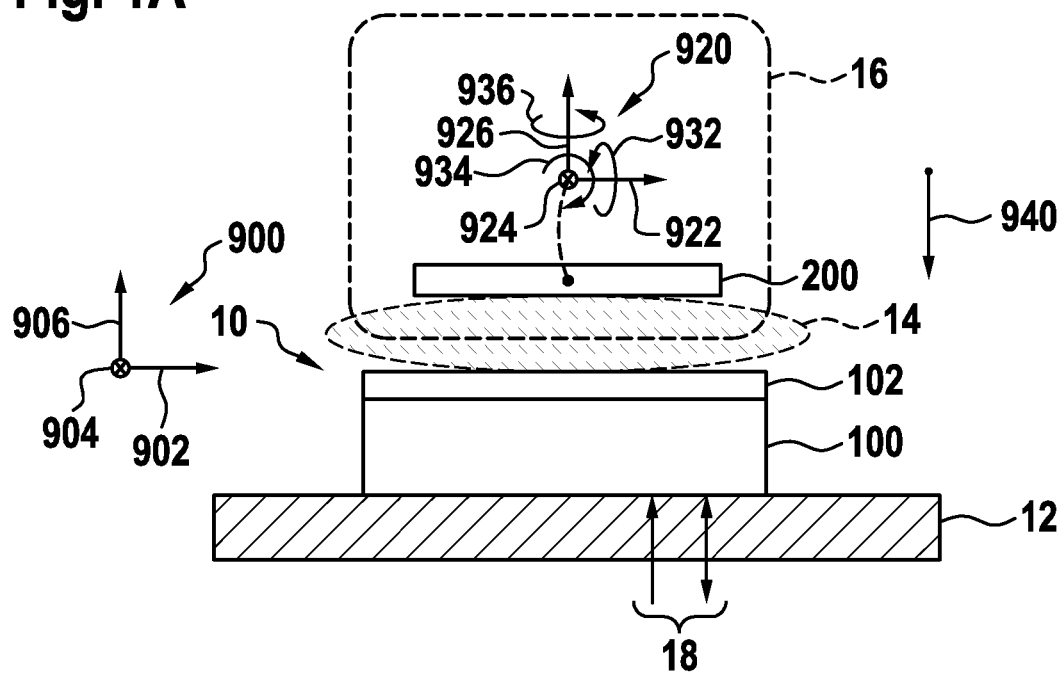
FIGS. 1A to 1E show conveying devices according to preferred embodiments in a schematic illustration.

FIG. 1A shows a conveying device 10 according to a preferred embodiment in a schematic illustration with associated coordinate systems 900 and 920. The illustrated conveying device 10 is arranged on a machine table 12 and has a stator 100 and a transport body 200. Schematically illustrated between the stator 100 and the transport body 200 is a levitation field 14, which in this case is an actively closed-loop-controlled magnetic field. The levitation field 14 is generated by actuating magnets and static magnets (not shown) on the active surface 102 of the stator 100, which are formed in the stator 100 and in the transport body 200 respectively. The levitation field 14 is situated between the stator 100 and the transport body 200, wherein the transport body 200 floats in the levitation field 14. The dashed line schematically shows an optionally attachable hermetic seal 16 which makes it possible, by means of the stator 100 outside the hermetic seal 16, to convey the transport body 200 within the hermetic seal 16. Furthermore, schematic terminals 18 are shown by means of which the conveying device 10 can be supplied with electrical energy and via which communication data can be received and/or transmitted.

The position and orientation of the transport body relative to the stator may in this case be presented in a stator coordinate system 900, which is defined by an x direction 902, a y direction 904 and a z direction 906. The transport body has its own transport body coordinate system 920, which is defined by an x1 direction 922, a y1 direction 924 and a z1 direction 926, and which has a roll angle 932, a pitch angle 934 and a yaw angle 936.

Here, the conveying device 10 is preferably controlled in closed-loop fashion such that the transport body 200 levitates in a stable manner and is guided on a predefined setpoint trajectory in terms of translation and rotation.

Figure 1B:
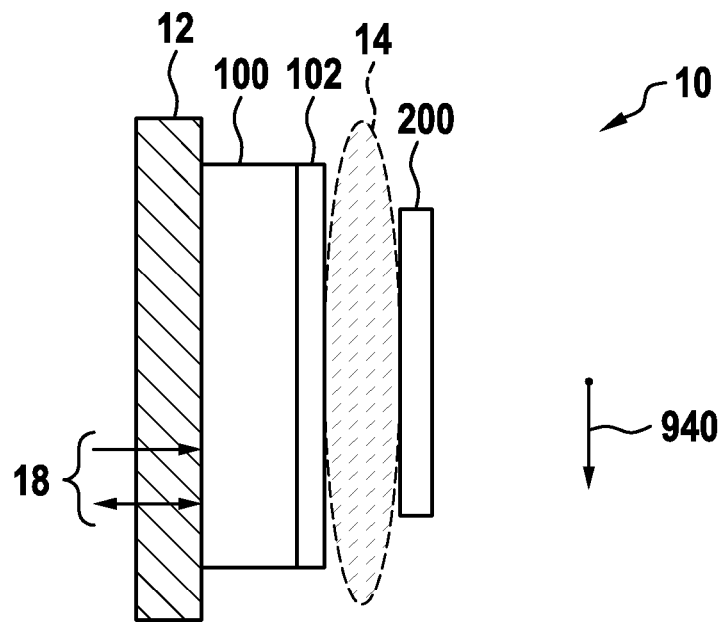

Whereas FIG. 1A shows a conveying device 10 operated on a table, that is to say arranged or lying in a plane such that the transport body 200 is accelerated in the direction of the stator 100 by the Earth's gravitational force 940, FIG. 1B shows a conveying device 10 operated on a wall, in the case of which the gravitational force accelerates the transport body substantially parallel to the conveying surface. Here, the magnetic coupling between the stator 100 and the transport body 200 is set such that the forces for compensating the gravitational force likewise act parallel to the conveying surface.

Figure 1C:
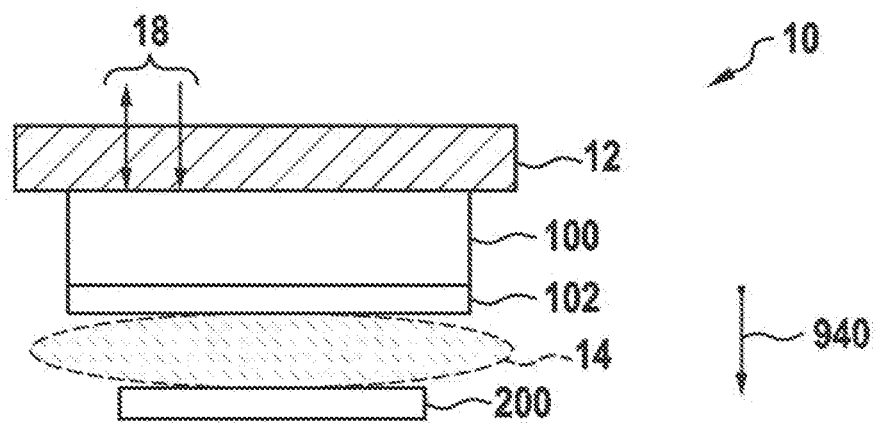

Here, the levitation field 14 prevents the transport body 200 from slipping down and/or falling down. If actuating magnets and static magnets (not shown) have permanent magnets, slipping down and/or falling down can possibly be prevented even in the event of an interruption in the feed of electrical power. The same applies to a conveying device 10 operated on a ceiling, which is schematically illustrated in FIG. 1C.

Figure 1D:
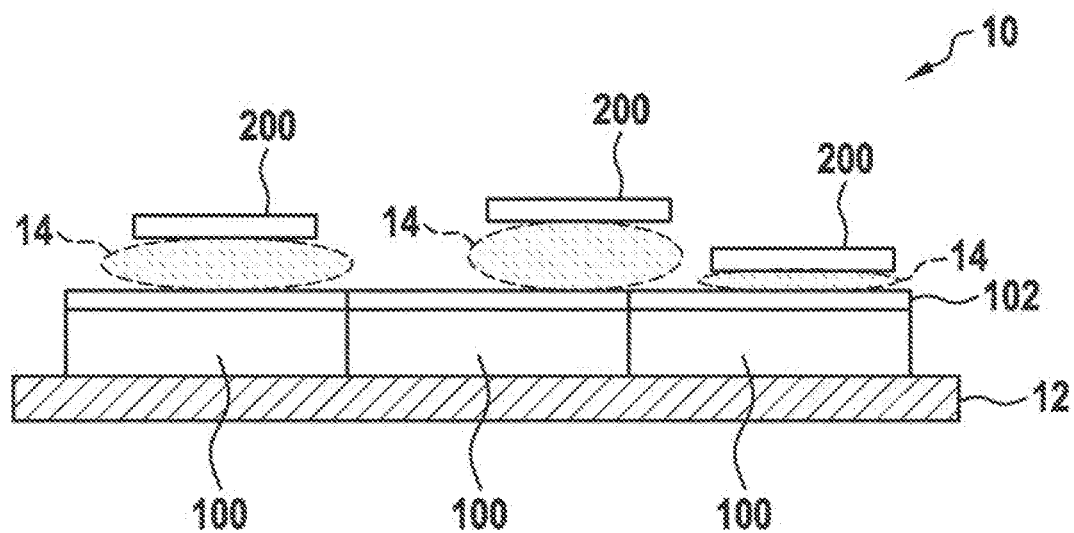

FIG. 1D shows, in a schematic illustration, a conveying device 10 with three transport bodies 200, which are transported by means of three mutually adjacently arranged stators 100 or stator modules, wherein the stator modules form a planar active surface 102. Furthermore, FIG. 1D shows positioning of the transport bodies 200 at different lifting heights or with different spacings in the z direction 906.

Figure 1E:
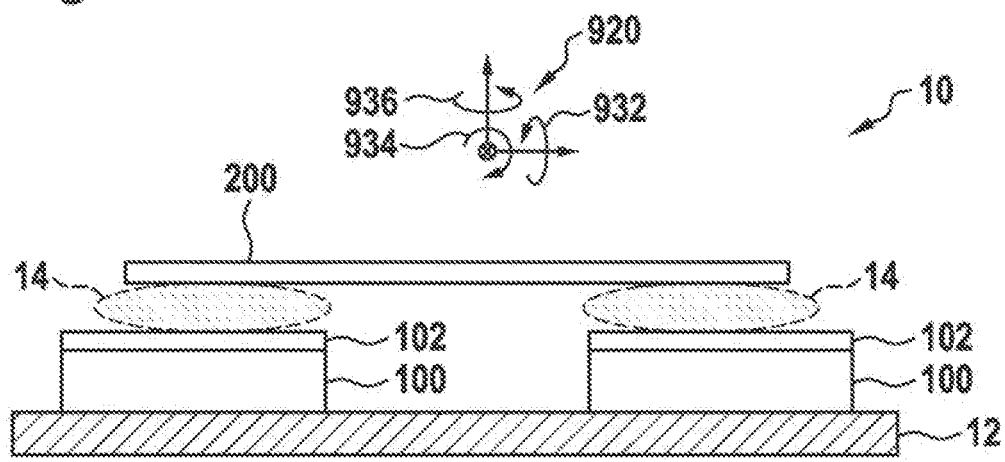

FIG. 1E shows, in a schematic illustration, a conveying device 10 according to a further preferred embodiment, in the case of which a transport body 200 is conveyed and/or positioned and/or oriented by means of two separate stators 100, wherein each stator is coupled only to a sub-region of the magnet arrangement in the transport body. In this way, the transport body 200 can be rotated through the yaw angle 936 and/or tilted through the roll angle 932 and/or inclined through the pitch angle 934.

Figure 2A:
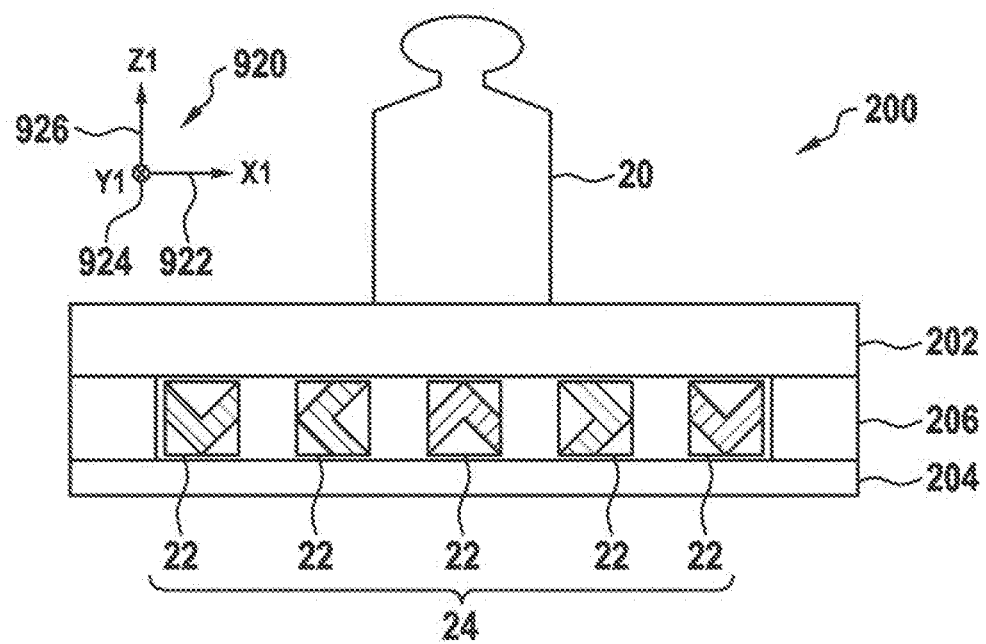
FIGS. 2A and 2B show a transport body according to a preferred embodiment.

FIG. 2A shows a transport body 200 according to a preferred embodiment in a schematic illustration in a cross section in the X1/Z1 plane, wherein the transport body 200 has a magnet group 24 of static magnets 22.

Figure 2B:
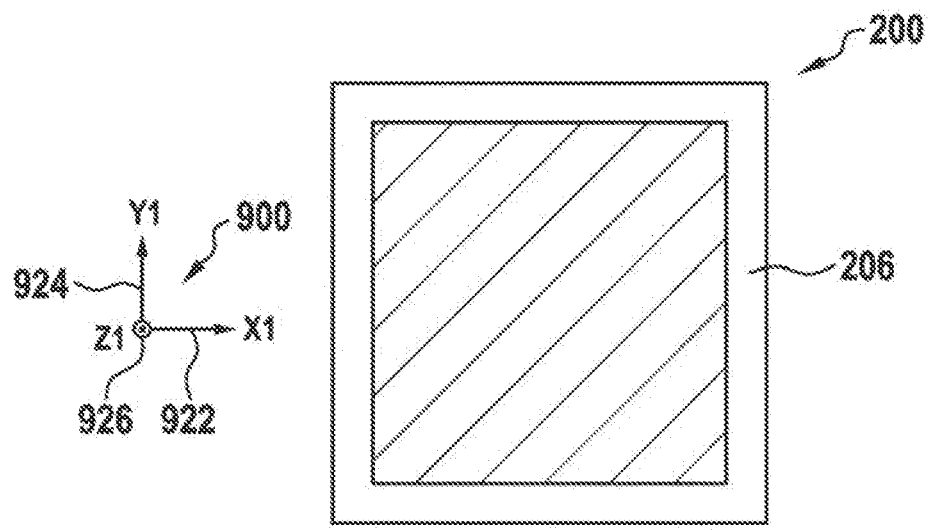

FIG. 2B shows the transport body from FIG. 2A in a plan view. The transport body 200 furthermore has an upper cover element 202 and a lower cover element 204, which are arranged adjacent to the magnet group 24 above and below the latter respectively. In the embodiment shown, "above" and "below" refer to different positions along the z1 direction 926. At the sides of the transport body 200 in the x1 direction 922 and y1 direction 924, an edge element 206 is formed adjacent to the magnet group 24.

Here, the transport body 200 may serve as a mechanical link between goods for transport 20, on the one hand, and the stator 100, on the other hand. The transport body 200 is preferably formed as a mechanically rigid element and configured to support and transport goods for transport on a top side of the upper cover element 202. The goods for transport 20 may preferably be fixed to the transport body 200 and then be guided jointly with the transport body 200 on a setpoint trajectory over the stator 100 and/or held in stable fashion at a setpoint position. In the embodiment shown, the transport body 200 is electrically passive, that is to say, to perform its function, it requires no electrical energy or terminals and has in particular no actuating magnets.

In the embodiment shown, the transport body 200 comprises a multiplicity of static magnets 22 in an areal arrangement in the X1/Y1 plane, which are arranged as a magnet group 24 in a geometrical arrangement, wherein the geometrical arrangement of the static magnets 22 relative to the transport body 200 is fixed, and the static magnets 22 thus do not move relative to the transport body 200. For example, the upper cover element 202 and/or the lower cover element 204 and/or the edge element 206 may be configured to at least partially fix the static magnets 22 in their position or in their geometrical arrangement. Alternatively or in addition, the transport body 200 may have one or more further components in order to fix the static magnets 22. Preferably, the static magnets 22 comprise a permanent magnet and/or are formed as permanent magnets. The static magnets 22 particularly preferably have permanent magnets composed of rare earth alloys.

Here, the position of a magnet or static magnet 22 is preferably to be understood to mean the position of its center of gravity. A magnetization direction of the respective static magnet is described by a dipole vector, which is illustrated symbolically as a corresponding arrow. It can thus be seen in FIG. 2A that, in the embodiment shown, each static magnet 22 is, with regard to its magnetization direction, arranged or oriented differently than the respective adjacently arranged static magnet 22. In the case shown, they form a Halbach array, the magnetic field of which is particularly strong in the −Z1 direction and is attenuated in the opposite direction. Preferably, as static magnets 22, use is made of magnets which are substantially homogeneously magnetized, such that the dipole vectors of individual subvolumes of the respective static magnets 22 point approximately in the same direction as the overall dipole vector of the static magnet 22. The dipole vector points in the direction of the arrow tip.

The arrangement of the static magnets 22 in the transport body 200 is preferably coordinated with or adapted to an arrangement of actuating magnets 26 (see for example FIG. 7) in the stator 100 such that, in a working range of the transport body 200 on the respective stator 100, the forces and moments required for the transport can be transmitted from the stator 100 to the transport body 200, and/or all of the desired degrees of freedom of the transport body 200 can be controlled independently at all times.

FIGS. 3A to 3M show different arrangement of static magnets 22, which form a magnet group 24, in a plan view in a schematic illustration. In these figures, too, the arrows indicate the magnetization direction of the respective static magnet 22, wherein the static magnets labeled with a dot or an X have a magnetization direction which runs in the z1 direction 926 out of the plane of the drawing and into the plane of the drawing respectively.

FIGS. 3A to 3G show arrangements of static magnets 22 in a regular rectangular raster. A transport body 200 preferably has at least two static magnets 22 (see FIG. 3A) which are arranged linearly on a straight line, wherein the dipole moment of at least one of the static magnets is oriented non-parallel with respect to said straight line. This is particularly advantageous in order to be able to control the transport body 200, or move the latter in controlled fashion, in all six degrees of freedom. Preferably, a transport body 200 has in each case at least three static magnets 22 (see FIGS. 3B to 3G) which are situated in a spatial plane, for example in the x1-y1 plane, and/or form a complex three-dimensional spatial arrangement.

Arrangements in which the static magnets 22 are all arranged in one arrangement plane are particularly suitable for applications in which predominantly translational movements parallel to the arrangement plane are to be performed, and/or rotations about the z axis of the stator 100 or the z1 axis of the respective transport body 200.

Figure 3A:
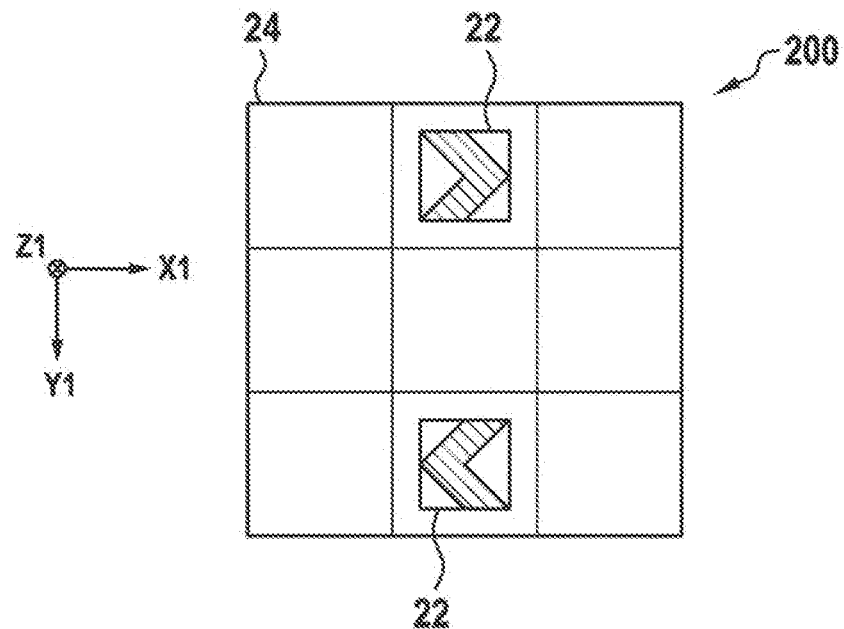
Figure 3B:
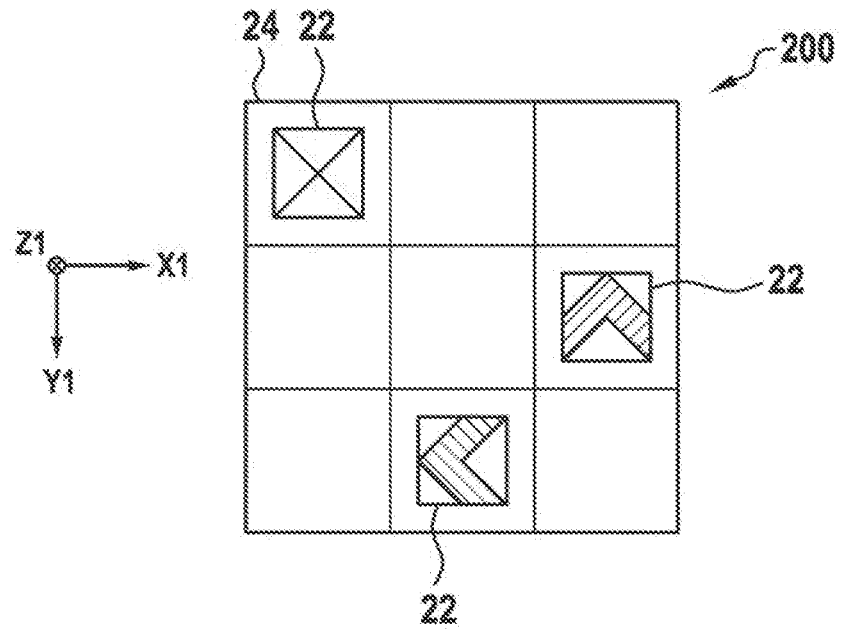
Figure 3C:
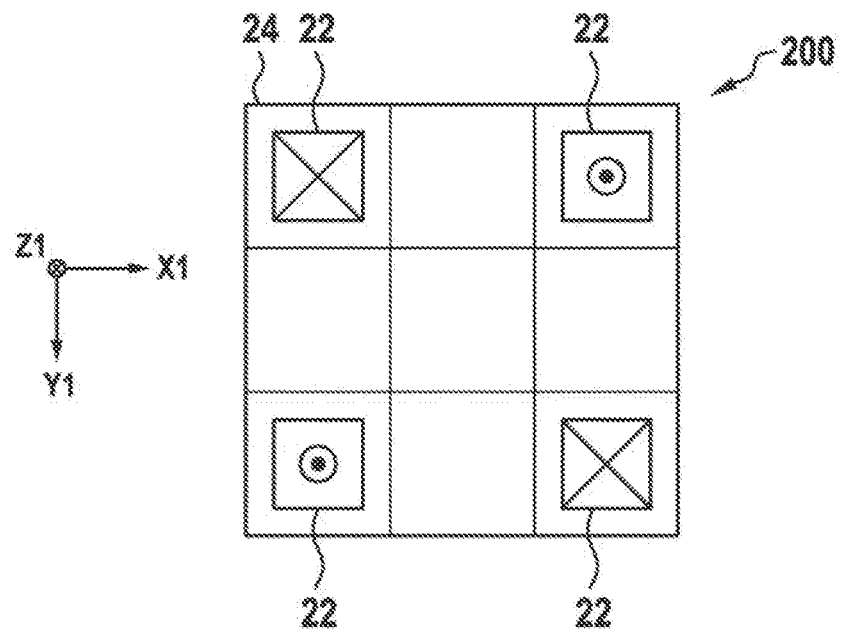
Figure 3D:
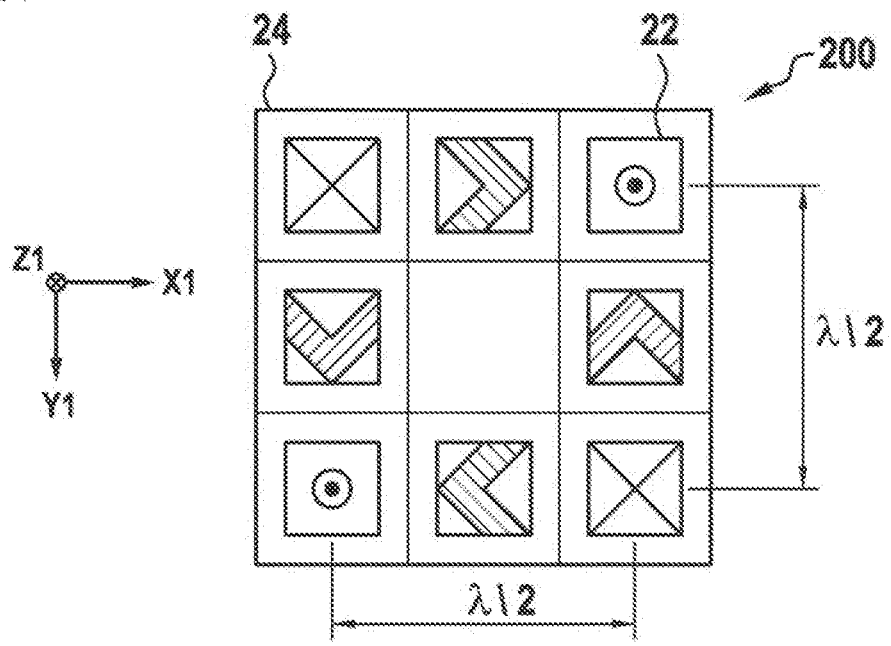
Figure 3E:
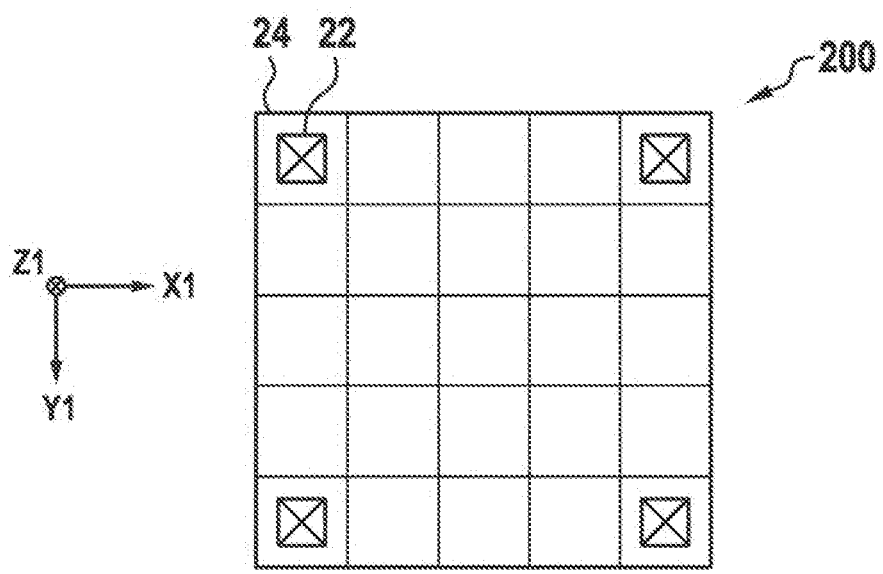
Figure 3F:
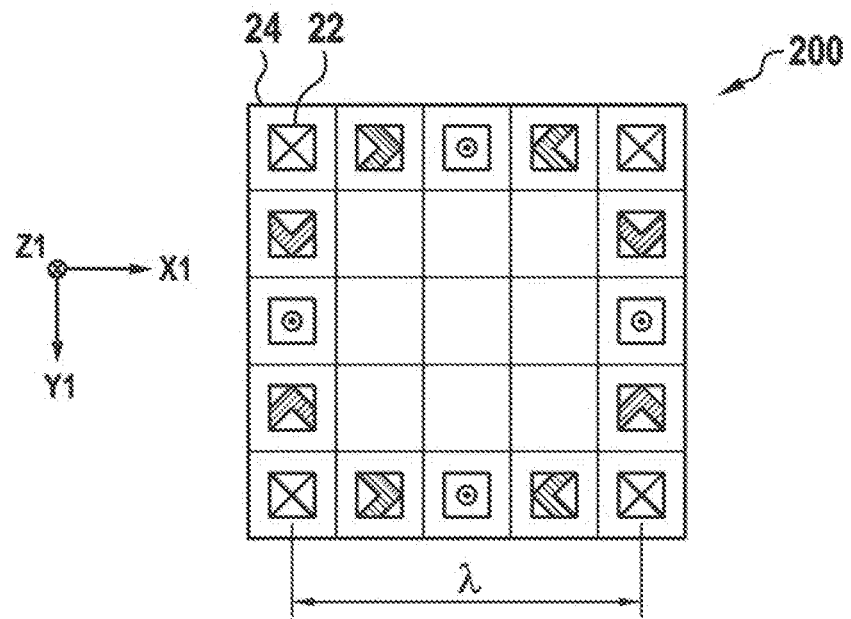
Figure 3G:
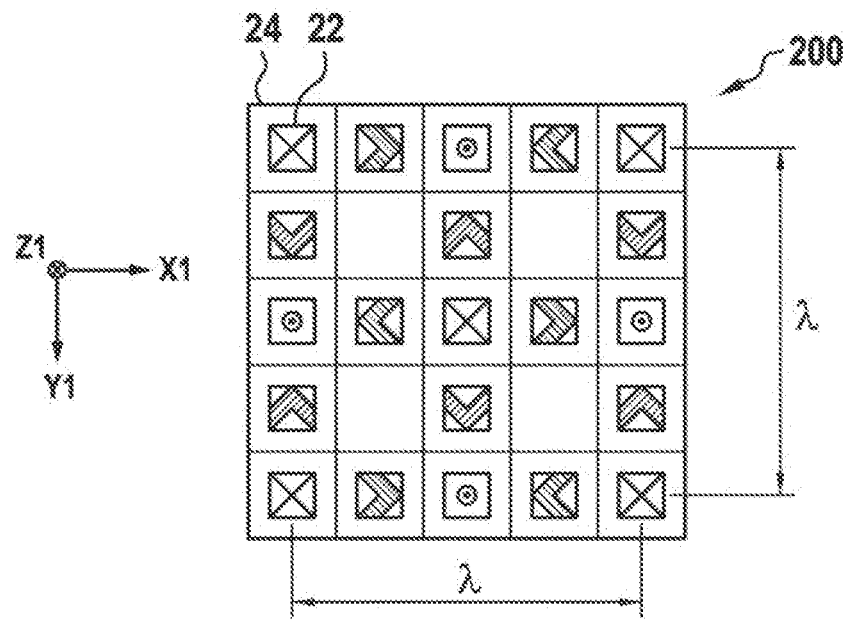
Figure 3H:
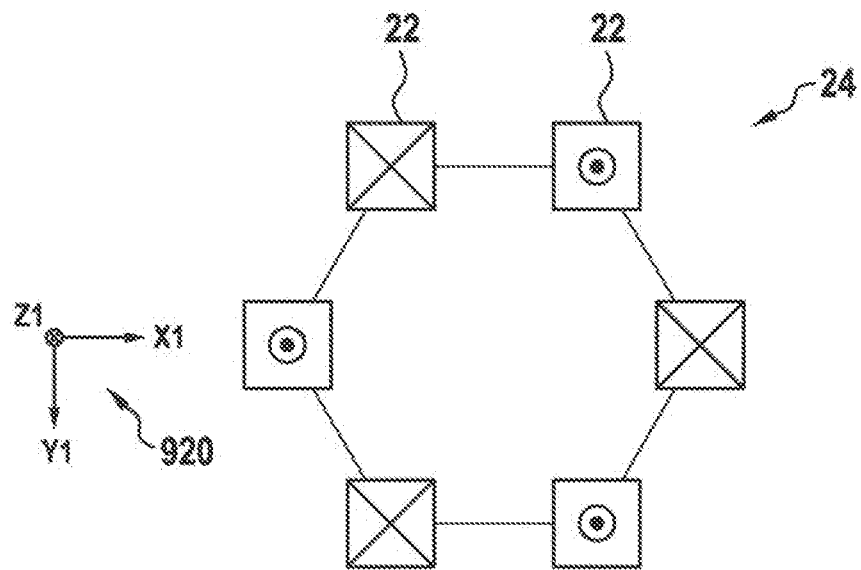

The magnet groups 24 preferably have static magnets 22 which are arranged as at least one Halbach array. The one or more Halbach arrays are preferably oriented or arranged such that the magnetic field or the magnetic field strength is increased in the direction of the stator 100 and/or is reduced in the direction of the goods for transport 20 and/or in the direction of possible adjacent transport bodies 200 which are possibly conveyed on the same stator 100. Exemplary arrangements of static magnets 22 which form, inter alia, Halbach arrays are illustrated in FIGS. 3D, 3F and 3G. Here, a length λ indicates the length of a Halbach period, that is to say a period of a Halbach array.

Figure 3I:
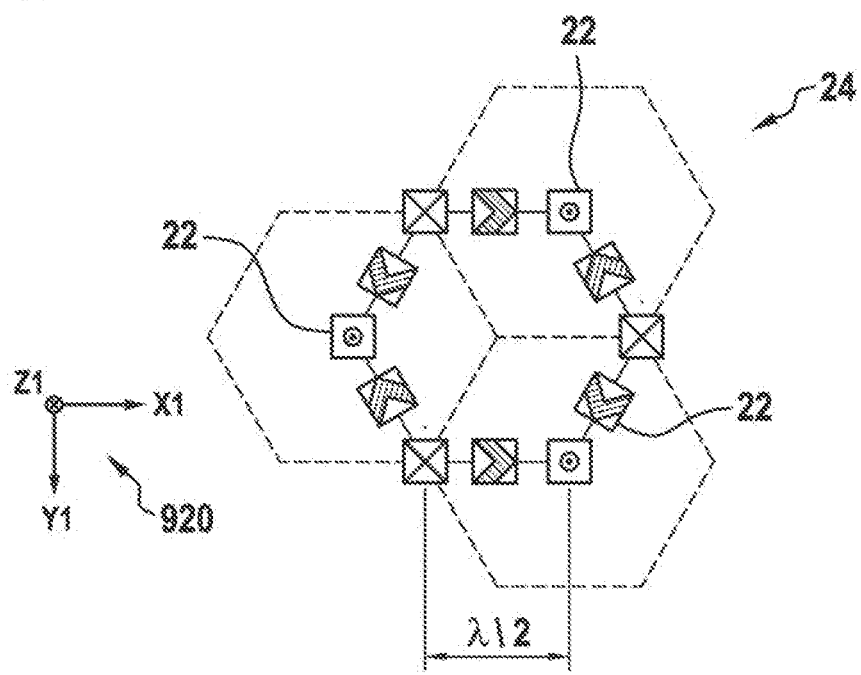
Figure 3K:
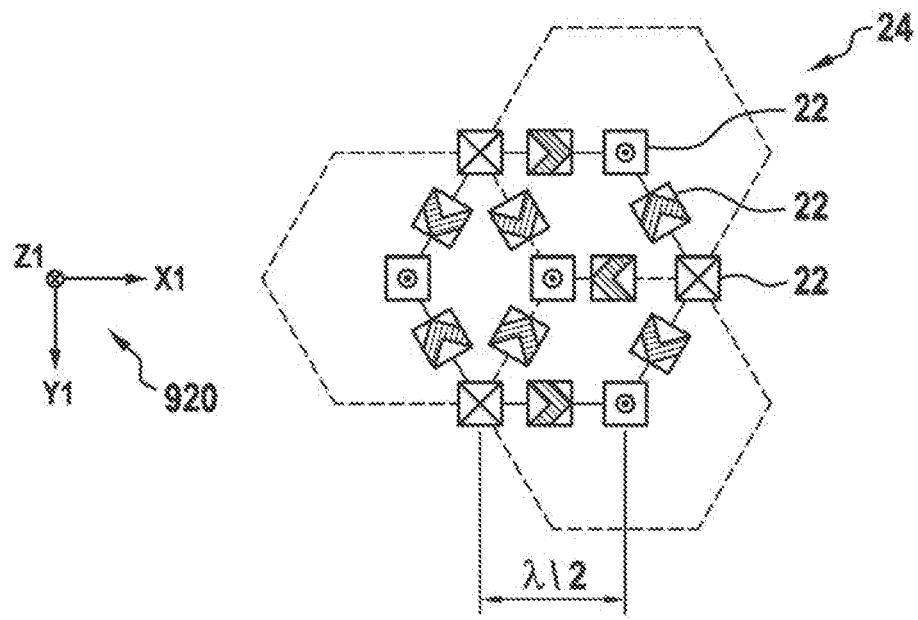
Figure 3L:
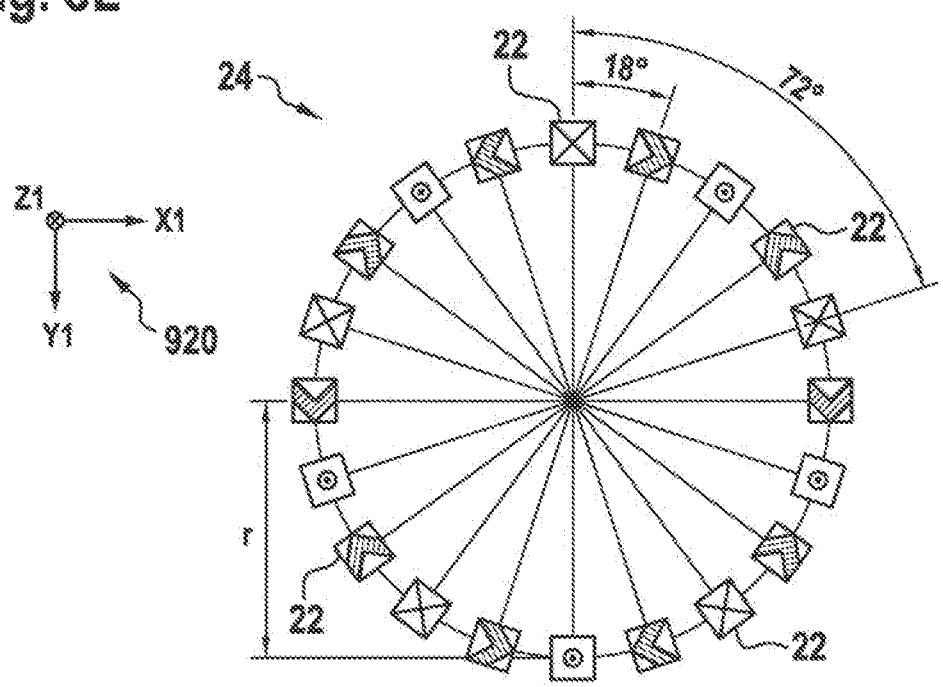
Figure 3M:
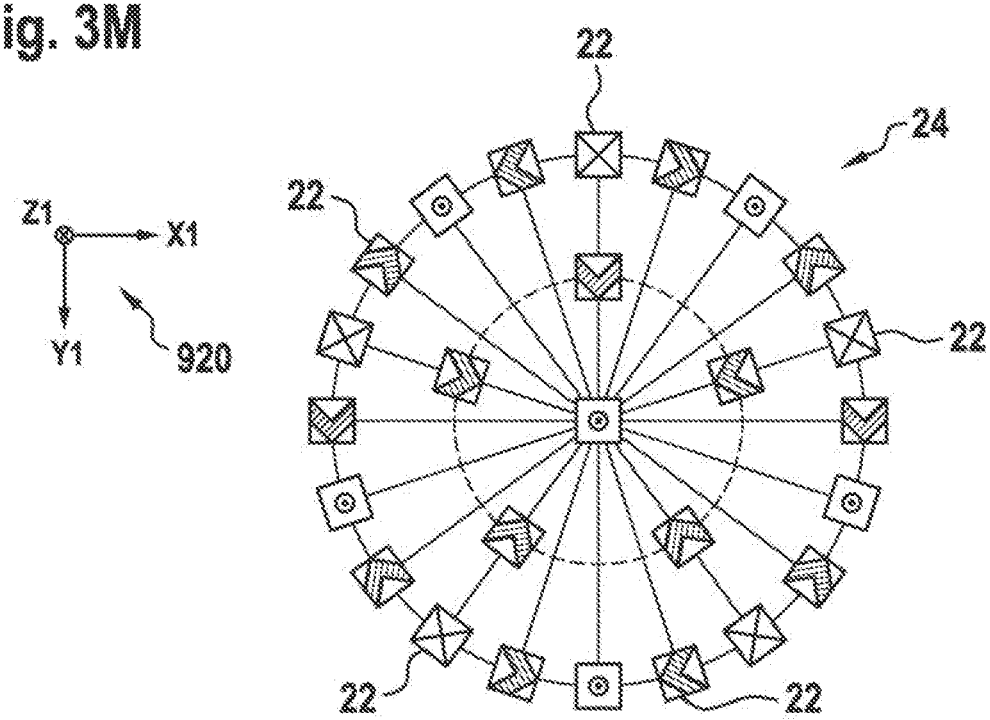

FIGS. 3H to 3K show magnet groups 24 in which the static magnets 22 are arranged along a hexagonal raster. The arrangements in FIGS. 3I and 3K are in this case based on a 2-dimensional arrangement of Halbach arrays. FIGS. 3L and 3M show magnet groups 24 in which the static magnets 22 are arranged along a circular raster. In particular, FIG. 3L shows an arrangement in which the static magnets 22 are arranged in five Halbach arrays or Halbach periods over in each case an angle range of 72°. Here, the static magnets 22 are arranged equidistantly with an angular interval of 18°. The arrangement in FIG. 3M has, in addition to the arrangement shown in FIG. 3L, five radially arranged Halbach arrays which share one common static magnet 22 at the central point or in the center of the circular arrangement. Such arrangements may advantageously be combined with a stator magnet arrangement with a square raster. In particular, such an arrangement may be advantageous in order to avoid singularities with regard to the arrangement of actuating magnets and static magnets relative to one another.

Figure 4A:
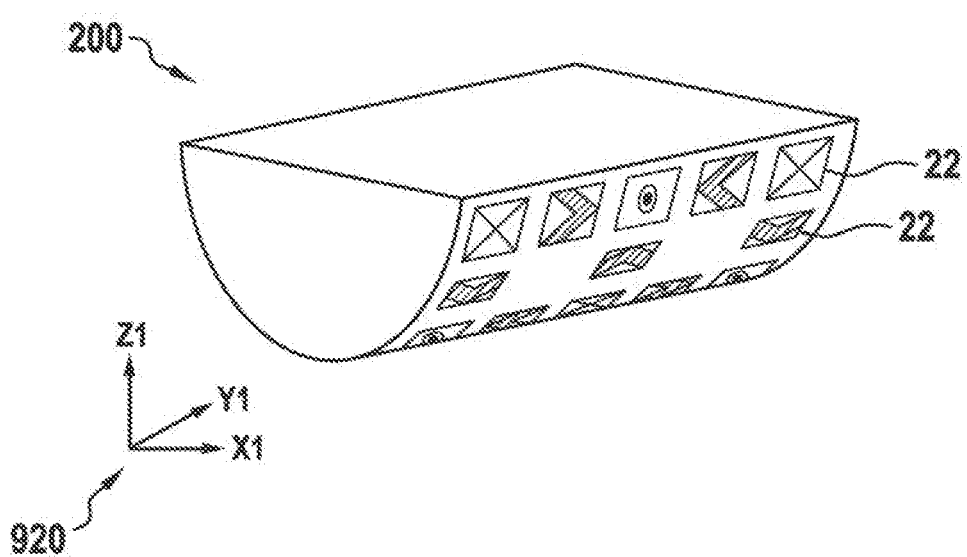
FIGS. 4A to 4C show preferred embodiments of a transport body.
Figure 4B:
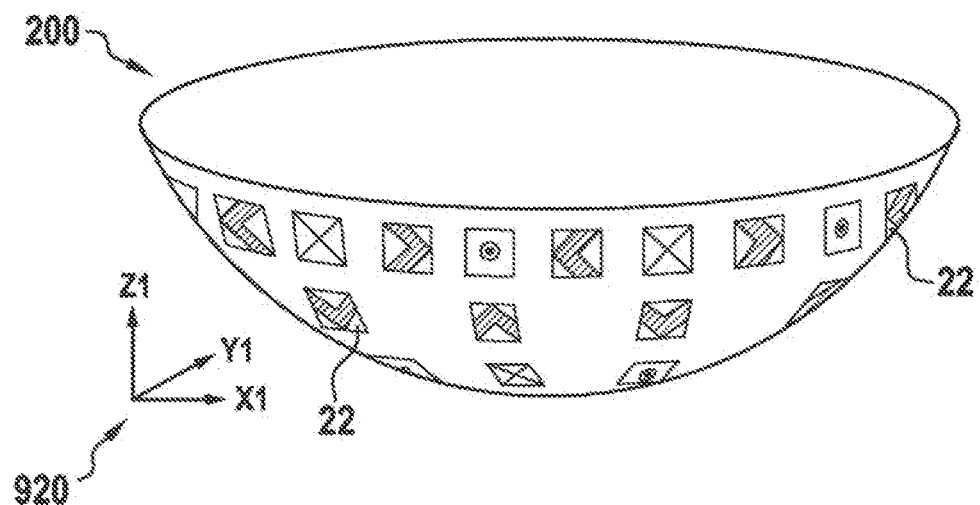
Figure 4C:
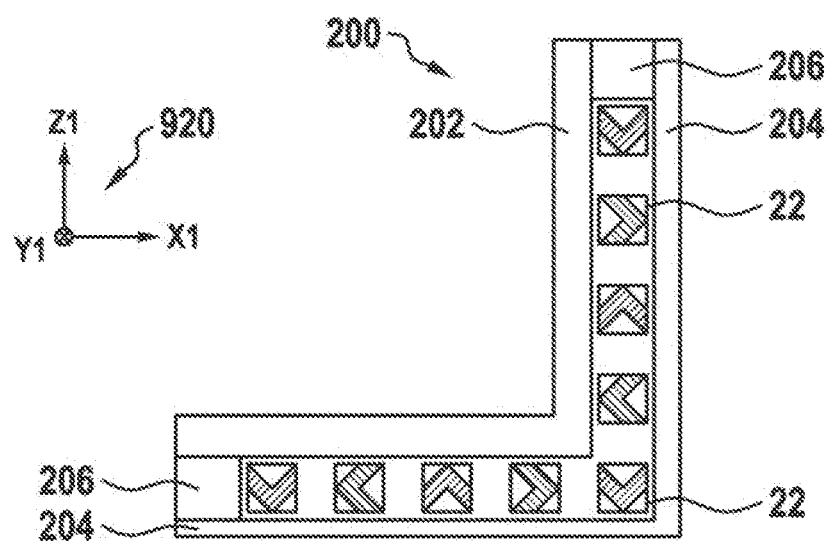

FIGS. 4A to 4C show preferred embodiments of a transport body 200, which have a magnet group 24 in the case of which the static magnets 22 are arranged in a three-dimensional arrangement. For a clearer illustration, the lower cover layer 204 and the upper cover layer 202 are not illustrated. Here, FIG. 4A shows a partially cylindrical arrangement of the static magnets 22, which can for example provide an increased pivot range in the case of rotations about the y1 axis. FIG. 4B shows a spherical-segment-shaped arrangement of the static magnets 22, which can provide an increased pivot range in the case of rotations both about the x1 axis and about the y1 axis. Neither arrangement is necessarily subject to restrictions with regard to rotatability or pivotability about the z1 axis.

The arrangement of the static magnets 22 on a curved plane can offer an increased pivot angle range in at least one direction of the transport body 200. For example, a cylindrical transport body 200, the curved lateral surface of which as active surface levitates on a stator 100, can possibly perform an endless rotation about its cylinder axis. An endless rotation about the z axis of the stator 100 may additionally be possible.

By means of a surface which is curved in two spatial directions, it is for example possible for the pivot angle range to be expanded in two spatial directions of the transport body 200. For example, a spherical transport body 200 equipped with static magnets 22 may possibly perform endless rotations in all spatial directions.

The transport body 200 may also be designed as a cylindrical or spherical segment, as shown for example in FIGS. 4A and 4B, with a curved side which is equipped with magnets and with a planar side which is designed for holding goods for transport. These arrangements may for example offer the possibility of realizing a goniometer table with a large pivot angle range (for example 90 degrees) which can additionally perform a rotation about the z1 axis and preferably a translation in all spatial directions. This arrangement can for example advantageously be used in machining processes such as laser machining or in inspection processes such as industrial image processing, because, for example, a workpiece inserted as goods for transport 20 can be positioned and/or oriented freely within wide limits under a machining tool or under the inspection means. Additionally, it is optionally possible for workpieces to be transported into and out of a processing position quickly, such that an often economically inefficient workpiece change time, in which the process cannot be utilized, can be minimized.

FIG. 4C shows a transport body 200 according to a further preferred embodiment, in which the static magnets 22 are arranged in an angled arrangement. In particular, the transport body 200 that is shown has static magnets 22 which extend along a first limb horizontally in the X1/Y1 plane and along a second limb in the X1/Z1 plane. In this way, a transport body 200 with two active surfaces can be provided, for example as shown with one horizontal and one vertical active surface, for example in order to be levitated or conveyed by differently arranged stators 100, for example by one horizontally arranged and one vertically arranged stator 100, at different times or simultaneously. Such an arrangement may be used for example in a transport body 200 which is operated in continuous alternation on differently oriented active surfaces. For example, a transport body 200 may have two active surfaces arranged at a 90° angle. If said transport body is operated on an arrangement of two stators which are likewise arranged at an angle of 90° with respect to one another, wherein one stator 100 is operated horizontally and the other stator 100 is operated vertically, a switch from floor operation to wall operation is for example possible without the need for interruption.

A structural component or housing or framework of a transport body 200, which for example holds together the individual components of the transport body 200, such as for example the static magnets 22, is preferably produced from a non-ferromagnetic material, for example from plastic and/or ceramic and/or non-ferrous metals. Optionally, said structural component or housing or framework has an edge element 206 which is not equipped with magnets and which serves for example as a spacer with respect to other transport bodies 200, such that, preferably, mutual contact forces between two transport bodies 200 which are in contact are limited, and free positionability of the two transport bodies 200 is preferably not impeded even when these are in contact.

The transport bodies 200 may be equipped, at the side facing toward the stator 100, with a lower cover element 204, which has for example a cover layer which preferably acts as a spacer with respect to possible objects in the surroundings of the transport body 200 and which can preferably reliably limit the spacing and thus the maximum effective forces of the static magnets 22. In this way, it is for example possible to achieve a reduction in the risk of injury during the handling of transport bodies 200, such as for example the risk of pinching of fingers in the event of a movement improperly close to a ferromagnetic object. Furthermore, it is preferably possible to achieve an overload limitation for drives or actuating magnets in the stator 100, because the forces and moments exerted by the transport bodies 200 on the actuating magnets in the stator 100 can preferably be limited. Furthermore, it is preferably possible to achieve that the transport bodies 200 are cleaned of adherent ferromagnetic particles in an improved manner, because the holding forces are lower. An optional integration of additional functions into the lower cover element, such as for example a coil for the inductive transmission of energy or a data carrier for the identification of the transport body 200, may also be advantageous here.

Multiple transport bodies 200 may be coupled mechanically and/or in terms of control, for example in order to jointly perform a function. For example, a passive mechanical kinematic bar mechanism, the bars of which are actively driven and positioned by separate transport bodies 200 can perform handling tasks. In another example, multiple transport bodies 200 can jointly transport loads, which are for example too heavy for a single transport body 200, by virtue of said transport bodies being moved or conveyed preferably in synchronized fashion.

Figure 5:
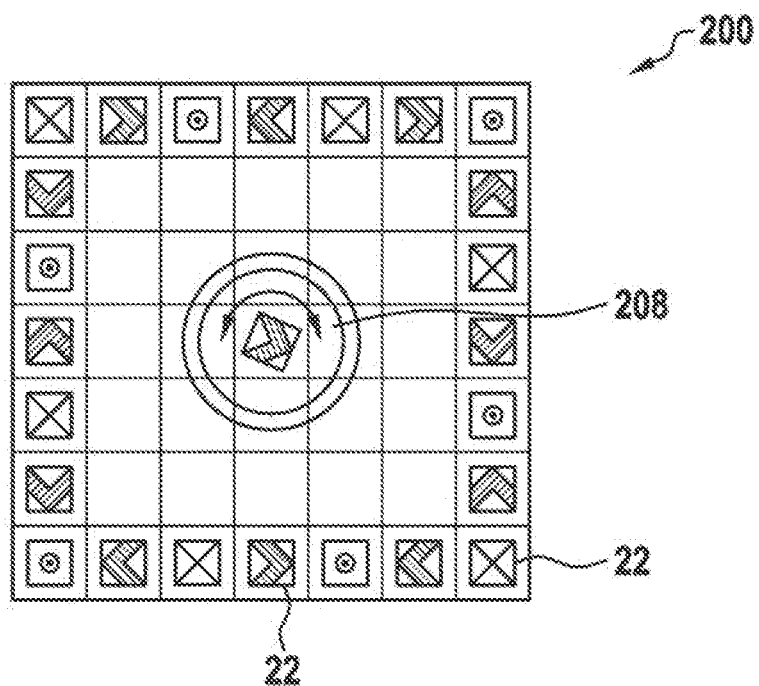
FIG. 5 shows a transport body according to a preferred embodiment with an additional function.

In a further preferred embodiment, a transport body 200 may also have internal degrees of freedom and for example be composed of multiple components which are movable relative to one another, such that said transport body preferably has a total of more than six degrees of freedom. Through the provision of static magnets 22 in several of the components, it is preferably possible for the more than six degrees of freedom of the transport body 200 to be actively controlled. As illustrated in FIG. 5, it is for example possible for a disk 208 which is mounted rotatably in the transport body 200 to be rotated, for example in order to perform an additional function on the transport body 200, such as for example a gripping or clamping function for goods for transport 20.

Furthermore, in a preferred embodiment, a transport body 200 may be equipped with functional groups for further additional functions. For example, a mechanical transmission of energy may take place by virtue of a disk, which is preferably rotatably mounted and equipped with magnets, being actively driven in the transport body 200 by the stator 100. For the drive, the disk of the stator 100 is treated for example as a seventh degree of freedom. Also, it is optionally possible for a contactless electrical transmission of energy to be realized, for example by virtue of coils for inductive energy transmission being integrated in each case in the stator 100 and in the transport body 200. Alternatively or in addition, it is for example possible for a permanently rotating magnet in the stator 100 to induce an alternating-current voltage in a coil in the transport body 200, which alternating-current voltage can preferably be utilized for the supply of electricity to the transport body 200. During locomotion of the transport body 200, the task of inducing the additional function is transferred continuously to other magnet groups 24 or actuating magnets of the stator 100, which are situated for example in a region of action of the induction coil. It is also for example possible for a contactless transmission of data between the stator 100 and transport body 200 to be realized, for example by means of inductive and/or optical transmitters and receivers. It is furthermore optionally possible for a localization and/or identification of the transport body 200 to be provided. For example, an optical, camera-based sensor in the stator 100 may read out a position or identification code which is applied to that side of the transport body 200 which faces toward the stator 100. For example, at least one part of the transport body 200 may be equipped with an identification element, for example with a barcode, on the basis of which the conveying device 10 or the stator 100 can identify the respective transport body 200.

Figure 6A:
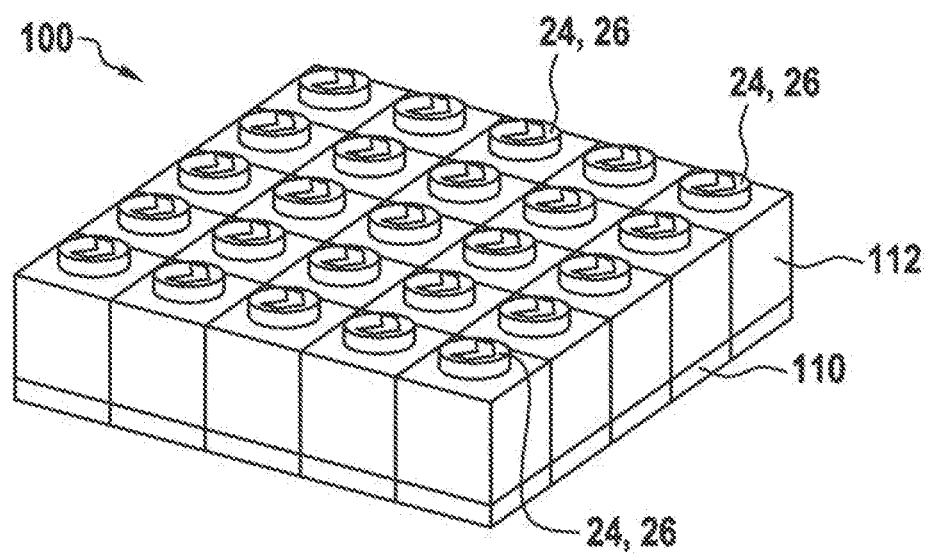
FIGS. 6A to 6D show stators according to preferred embodiments in a schematic illustration.
Figure 6B:
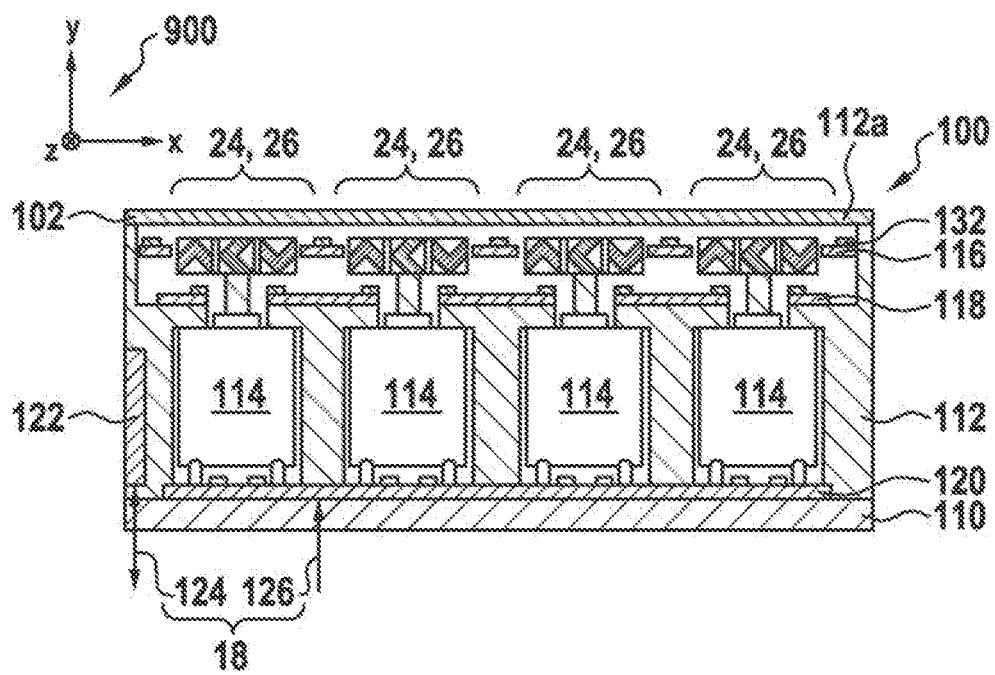

FIGS. 6A and 6B show, in a schematic illustration, a stator 100 according to a preferred embodiment in a perspective illustration (FIG. 6A) and in a cross-sectional view (FIG. 6B). Here, the stator 100 has a multiplicity of actuating magnets 26, which each in turn have a magnet group 24. The actuating magnets 26 are at least partially enclosed by a structural component 112 of a stator housing. Here, in the preferred embodiment shown, the magnet groups 24 are arranged on a surface or side of the stator 100 which, in the case shown, is the top side of the stator 100. Even though, in the illustration shown in FIG. 6A, the magnet groups 24 are all oriented in the same direction, that is to say their overall or effective dipole vectors which result from the individual dipole vectors of the magnets belonging to the magnet group 24, are arranged parallel, it is pointed out that the magnet groups 24 are formed or arranged so as to be movable such that they can rotate at least in their plane of arrangement relative to the stator housing. Although only three magnets are shown in each magnet group 24 in the cross-sectional view in FIG. 6B, the magnet groups 24 may have fewer or more than three magnets, which may be arranged in a one-dimensional, two-dimensional or three-dimensional arrangement.

The actuating magnets 26 or magnet groups 24 are connected to actuating elements 114, by means of which they can be changed in terms of their position and/or orientation. Here, an actuating magnet 114 has for example at least one drive, such as for example an electric motor, which is connected preferably via a drive shaft and/or a gearing and/or a linkage to the magnet group 24.

The magnetic fields required for the guidance of the at least one transport body 200 are generated by means of a controlled, for example closed-loop-controlled, movement of the magnet groups 24 or actuating magnets 26 in the stator 100. The magnetic field generated by the magnet groups 24 emerges at least partially from the active surface 102 of the stator 100 and exerts forces and/or moments on the static magnets 22 in the transport body 200. The direction and intensity of the forces and/or moments in the transport body 200 is influenced by the situation and/or orientation of the actuating magnets 26 or magnet groups 24 in the stator 100. The situation of the actuating magnets 26 or magnet groups 24 in the stator 100 is in this case preferably controlled in closed-loop fashion such that the transport body 200 floats and is guided in accordance with a predefined setpoint trajectory in all six dimensions or is held in stable fashion at a predefined setpoint position with a predefined setpoint orientation.

As shown in FIG. 6B, the stator 100 has an arrangement of movable actuating magnets 26. Actuating elements 114 can change the orientation and/or position of the magnet groups 24 or of the actuating magnets 26 in accordance with a setpoint specification. A transport body position determination unit 116 is configured to determine an actual position of all transport bodies 200 conveyed on the stator 100 or of all transport bodies in the region of influence of the respective stator 100. For example, the transport body position determination element 116 may have a sensor layer and/or a circuit board with sensors. A control element 122 may preferably evaluate the sensor signals provided by the transport body position determination element 116 and provide these for example to a superordinate installation. The actuating elements 114 may for example be contacted by means of a circuit board 120.

Furthermore, in the preferred embodiment shown, the stator 100 has a magnet position determination element 118, by means of which the actually present position and/or orientation of the magnet groups 24 or of the actuating magnets 26 can be ascertained. For example, the magnet position determination element 118 may have a sensor layer.

The arrangement of the magnet groups 24 in the stator 100 is preferably planar, that is to say it is preferable if all of the magnet groups 24 are arranged in one plane.

Figure 6C:
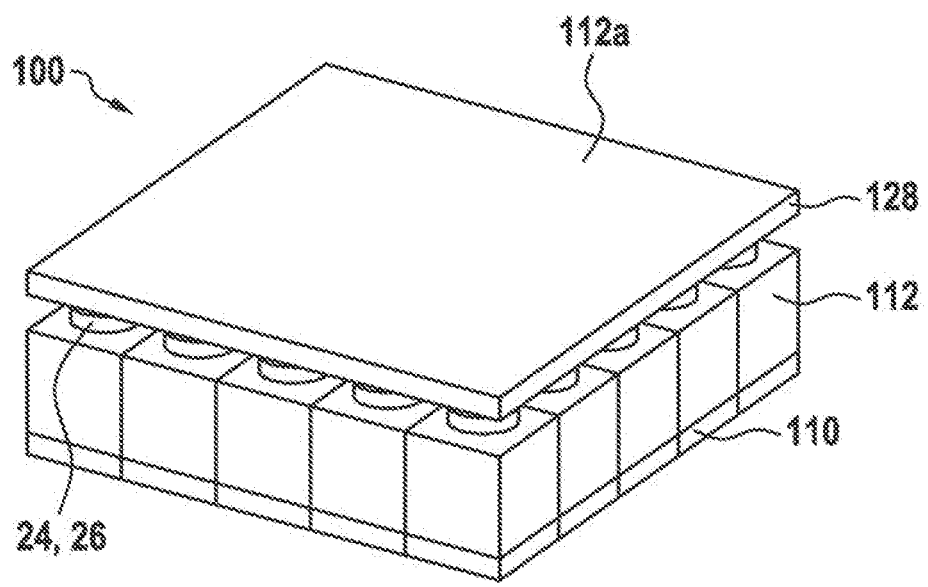
Figure 6D:
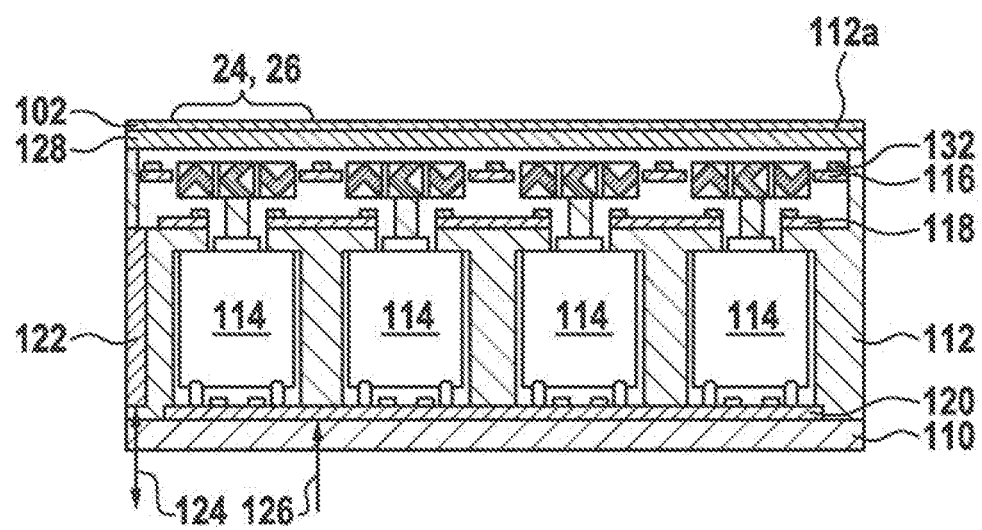

FIGS. 6C and 6D show a stator 100 according to a further preferred embodiment, which is similar to the embodiment shown in FIGS. 6A and 6B and which additionally has a cover 112a and an optional coil layer 128. The cover 112a is manufactured preferably from non-ferromagnetic materials. The magnetic field originating from the magnet groups 24 passes through the cover 112a to the outside, which cover is manufactured for example at least partially from plastic and/or non-magnetic metal and/or ceramic and/or glass. The cover 112a may for example shield the interior of the stator 100 with respect to the working space of the transport body 200 and thus prevent an ingress and/or escape of particles. Furthermore, the cover 112a may serve for reliably limiting the maximum effective forces of the actuating magnets 26 in the stator 100 on objects outside the stator 100. Here, the spacing may be configured such that a transport body 200 lying on the cover 112a preferably does not lead to blockage of the actuating elements 114. Additionally, an attraction force on ferromagnetic parts which have not been set down correctly on the cover 112a is limited, such that these can be easily removed again and do not lead to injuries during handling.

The coil layer 128 may for example be formed as a multi-layer circuit board with internally situated coils.

That surface of the cover 112a which faces toward the at least one transport body 200 preferably forms the active surface 102 of the stator 100. Optionally, a mechanical retraction device may be provided (not shown) which increases the spacing of all magnet groups 24 of the actuating magnets 26 from the active surface 102. The retraction device may for example be automatically activated when the conveying device 10 is at a standstill, in order that the magnetic fields emerging from the active surface 102 in the standstill situation are reliably limited. It is thus for example possible for handling actions to be performed in front of the active surface 102 without risk, and cleaning of adherent ferromagnetic particles can be facilitated.

The stator 100 may preferably be operated in any desired direction relative to gravitational force, for example operated on a table (transport body 200 floats above the active surface 102), operated on a wall (transport body 200 floats adjacent to the active surface 102) or operated on a ceiling (transport body 200 floats below the active surface 102). Operation of the overall system in an accelerated reference system or in the absence of gravity is also possible in principle.

The stator 100 is preferably of modular construction, such that multiple similar and/or different stator modules can be easily lined up together preferably in seamless fashion (see FIG. 1D). The stator modules are preferably equipped with data connections 124, for example with communication channels, such that information items relating to the states of the stator 100 and of the transport bodies 200 situated thereon can be transmitted preferably in real time.

The transport bodies 200 may preferably slide across freely from one stator module to another stator module. It is thus preferably possible for a working range of the transport bodies 200 to be expanded as required. Each module furthermore preferably has an interface for the supply of energy 126 and mechanical interfaces for the coupling to further stator modules and for simple integration into an installation.

The magnetic field of the stator 100 is preferably generated by means of a predominantly areal or planar arrangement of the magnet groups 24. The arrangement of the magnet groups 24 preferably forms a regular square raster of magnet groups 24, though other regular or irregular arrangements are also possible.

Figure 7A:
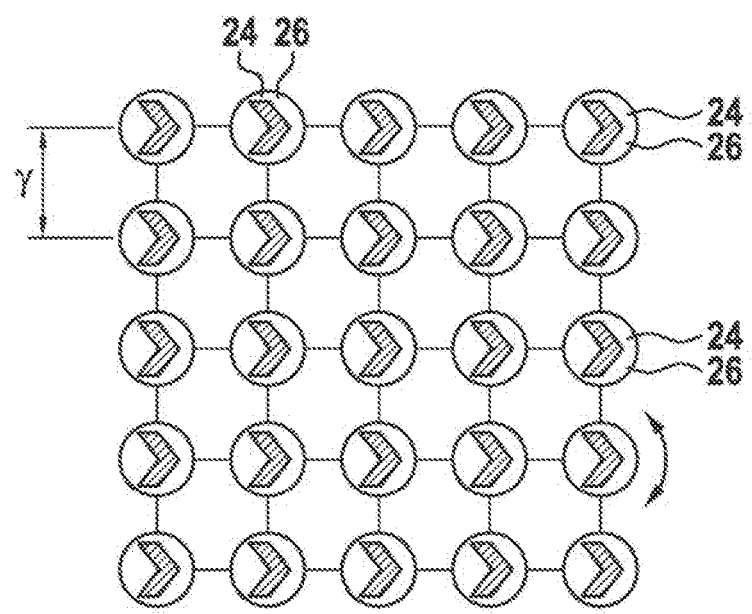
FIGS. 7A to 7E show exemplary arrangements of magnet groups or actuating magnets.
Figure 7B:
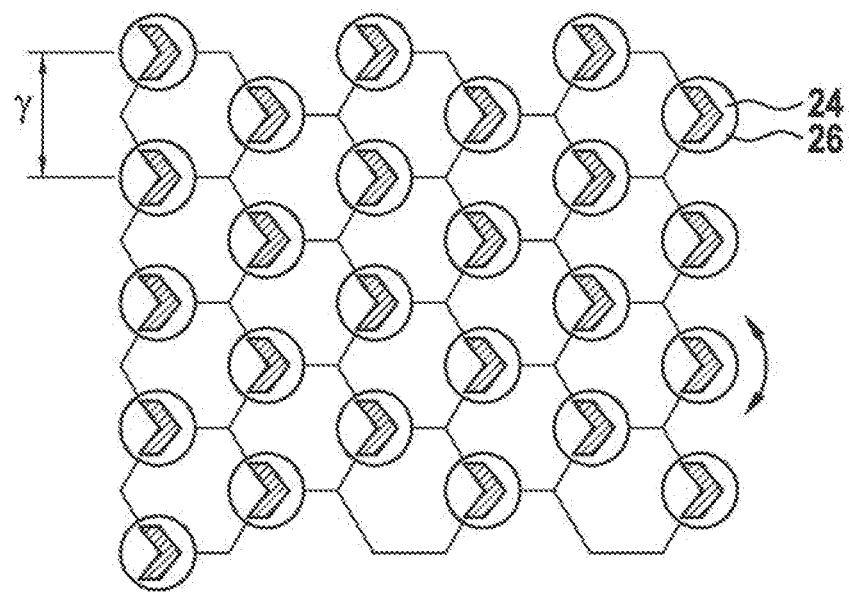
Figure 7C:
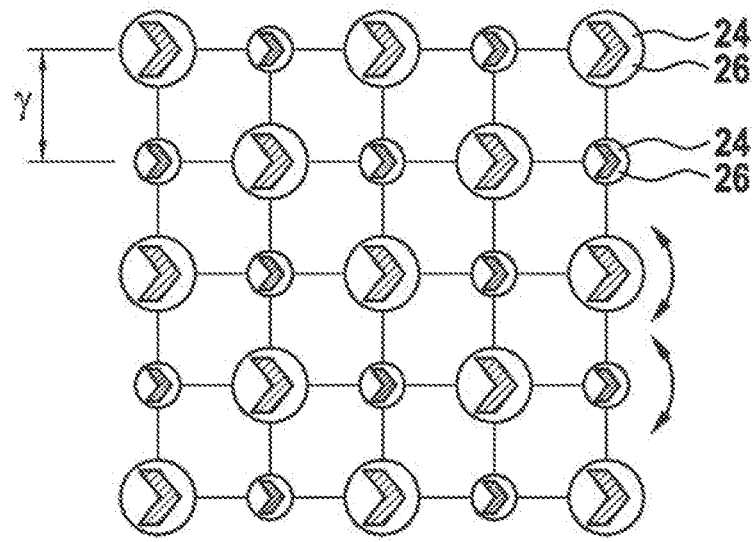
Figure 7D:
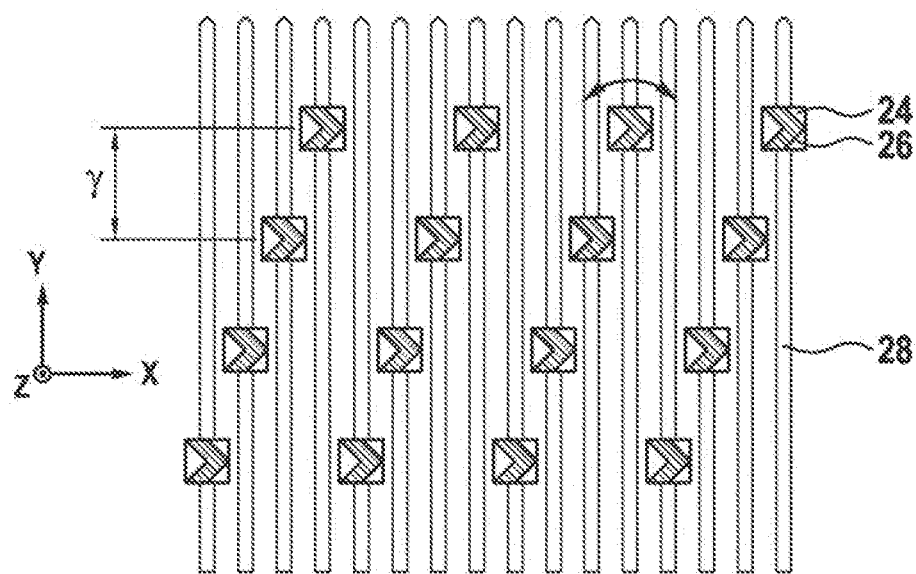
Figure 7E:
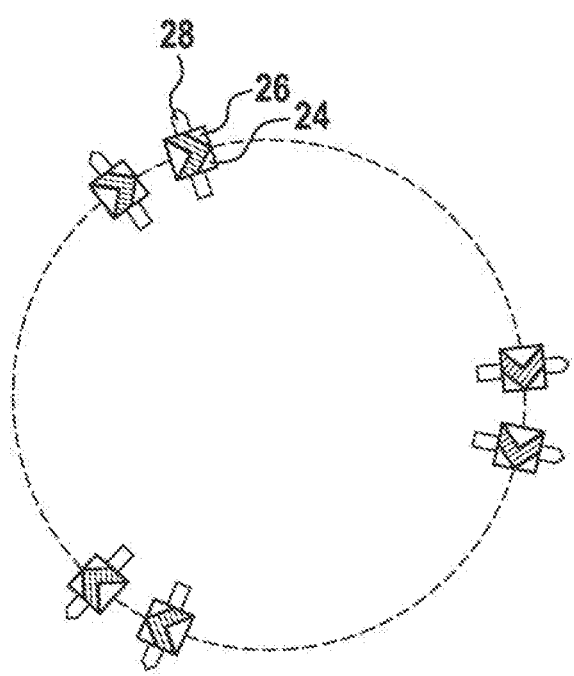

FIGS. 7A to 7E show exemplary arrangements of magnet groups 24 or actuating magnets 26. For example, FIG. 7A shows an arrangement of the magnet groups 24 in accordance with a rectangular, in particular square, raster. FIG. 7B shows an arrangement of the magnet groups 24 in accordance with a hexagonal raster. FIG. 7C shows an exemplary arrangement of different magnet groups 24 in accordance with a rectangular raster. For example, the magnet groups may differ in terms of their magnetic dipole moment. Furthermore, it is also possible for some of the magnet groups to rotate quickly or slowly, to be connected by means of different gearings to the drive, and/or to be operated by means of different drives. Arrangements as per FIGS. 7A to 7C are advantageous in particular if it is intended that the axes of rotation lie substantially perpendicular to the plane of arrangement. Furthermore, FIGS. 7D and 7E show arrangements in which the magnet groups are connected via drive shafts 28 to the drives, wherein the drive shafts run substantially parallel to the active surface 102. In the arrangement of FIG. 7D, the drive shafts 28 run parallel, and in the arrangement in FIG. 7E, said drive shafts run in at least approximately radial or circular fashion.

Figure 8A:
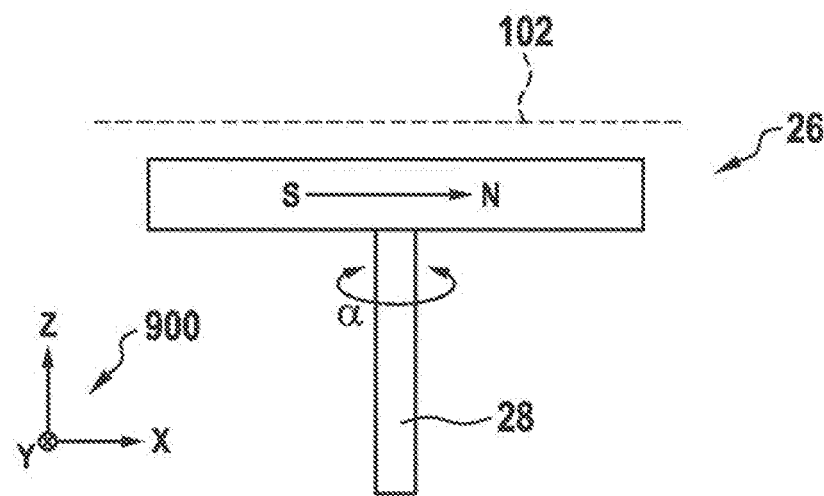
FIGS. 8A to 8H show preferred embodiments of actuating magnets and magnet groups and preferred arrangements.
Figure 8B:
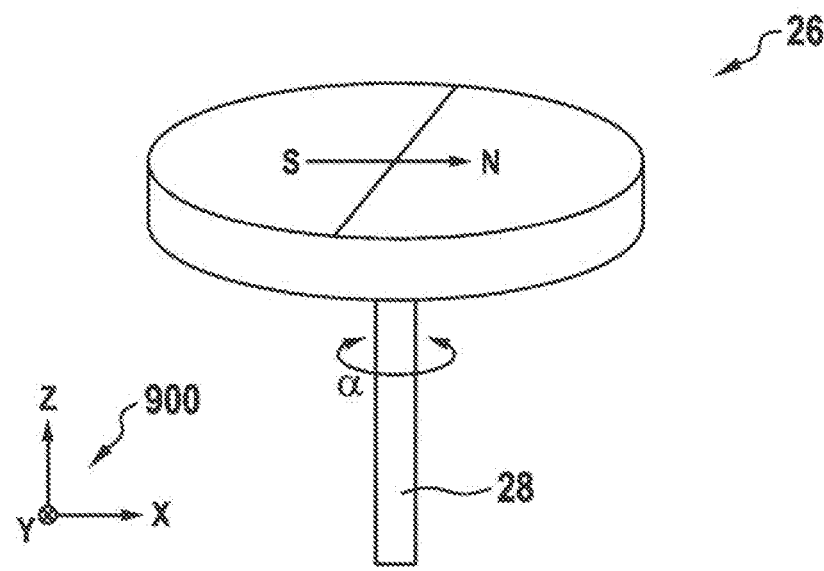
Figure 8C:
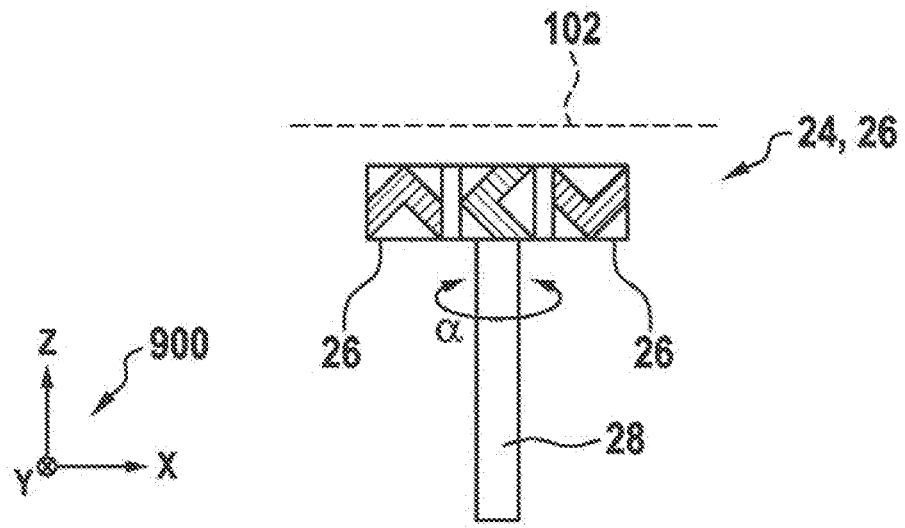
Figure 8D:
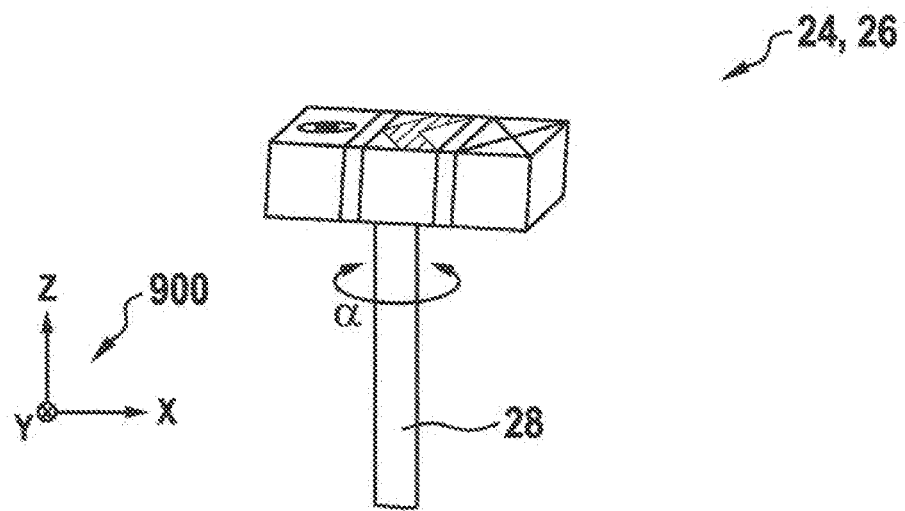

In a preferred embodiment, an actuating magnet 26 is formed by a single magnet, as illustrated in FIGS. 8A and 8B, or alternatively by an arrangement of several magnets in a magnet group 24, wherein the magnets are preferably mechanically fixedly connected to one another, as illustrated in FIGS. 8C and 8D. Alternatively, an actuating magnet 26 may be formed by a magnet group 24 which has multiple differently magnetized regions. Preferably, the magnet group 24 forms a Halbach array (see FIGS. 8C and 8D) which is oriented in the direction of the active surface. This offers the advantage that the flux density is increased in the direction of the active surface 102 and is reduced in all other directions, in particular in the direction of adjacent magnet groups 24. The actuating magnets 26 or magnet groups 24 illustrated in FIGS. 8A to 8D are in this case connected to the drive shaft 28 such that the axis of rotation of the drive is perpendicular to the active surface 102. Here, the angle α denotes the adjustment angle of the drive shaft 28 or of the actuating magnet 26 or of the magnet group 24.

Figure 8E:
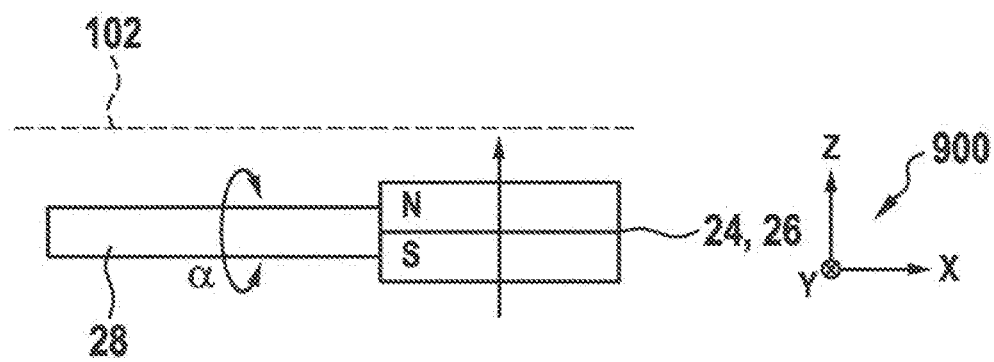
Figure 8F:
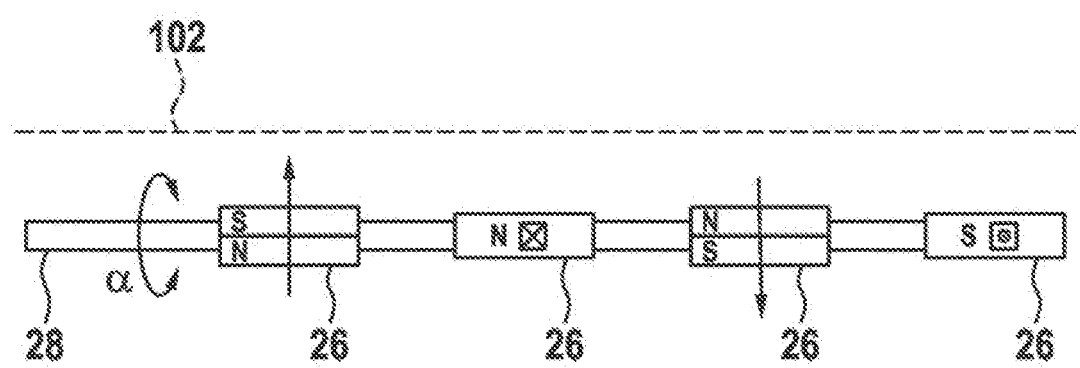

FIGS. 8E and 8F show arrangements in which the actuating magnets 26 or the magnet groups 24 are connected to the respective drive shaft 28 such that the drive shafts 28 run substantially parallel to the active surface 102. In such arrangements, a rotation of the actuating magnets 26 or of the magnet groups 24 thus takes place about the X axis 902.

Figure 8G:
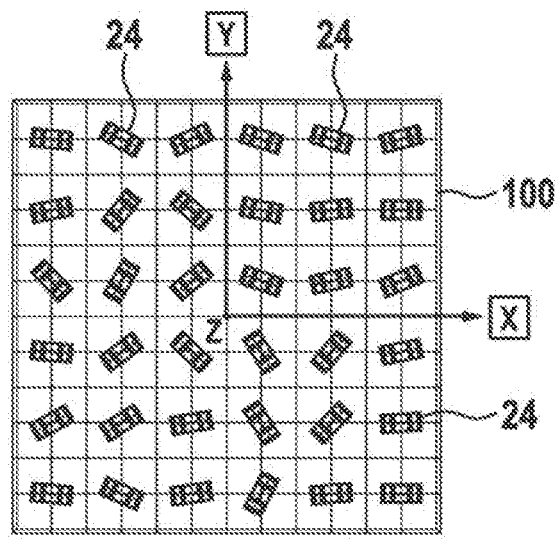
Figure 8H:
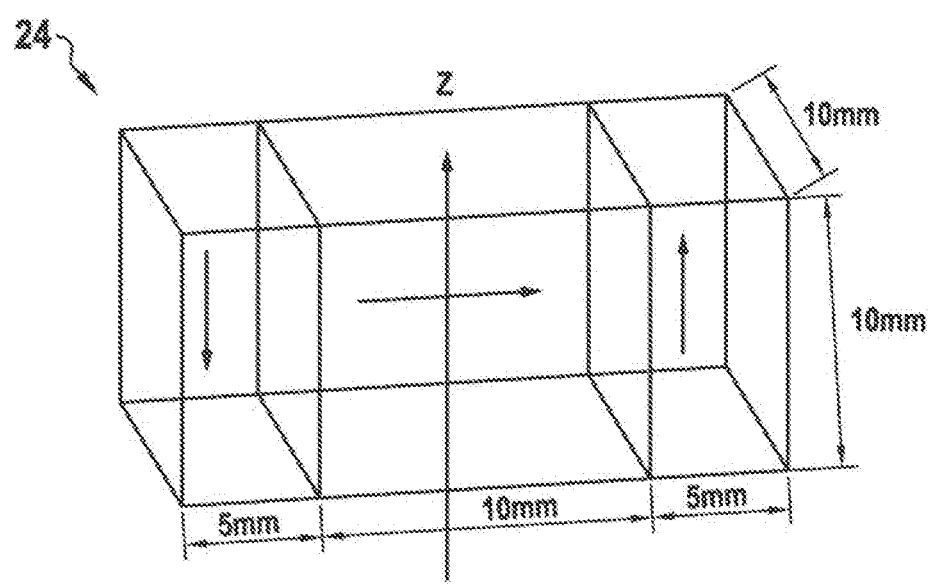

FIG. 8G schematically shows an arrangement according to a preferred embodiment of 6×6 magnet groups 24 in accordance with a square raster in a stator 100, wherein the magnet groups 24 are each designed as a Halbach array. A detailed illustration of an individual magnet group 24, in particular with typical dimensions according to a preferred embodiment of a magnet group 24 of said type, is shown in FIG. 8H.

The magnet groups 24 are preferably individually adjustable in the stator 100, that is to say can be varied in terms of their position and/or orientation. They may preferably perform a linear movement and/or a rotation and/or a superposed movement. A rotation is preferably performed about a structurally fixedly predefined axis of rotation of the drive shaft 28. In order to achieve an effective change of the magnetic field as a result of the rotation, the dominant dipole vector of the magnet group 24 is oriented preferably perpendicular to the axis of rotation of the drive shaft 28.

The axes of rotation of the magnet groups 24 may be oriented differently in relation to the active surface 102. They are preferably oriented perpendicular and/or parallel with respect to the active surface 102. The spacing between adjacent magnet groups 24 is selected such that the torques on the magnet groups 24 caused by the magnetic interaction thereof are low in relation to the typical torques caused by the transport body 200.

For the positioning and/or orientation of the magnet groups 24, actuating elements 114 are used which can preferably perform linear movements and/or rotations and/or superposed movements. An actuating element 114 preferably moves at least one magnet group 24. Use is preferably made of actuating elements 114 which can cover an angle range of 360° and which are preferably capable of performing endless rotations. This may be advantageous for numerous movements of the transport body 200.

Figure 9A:
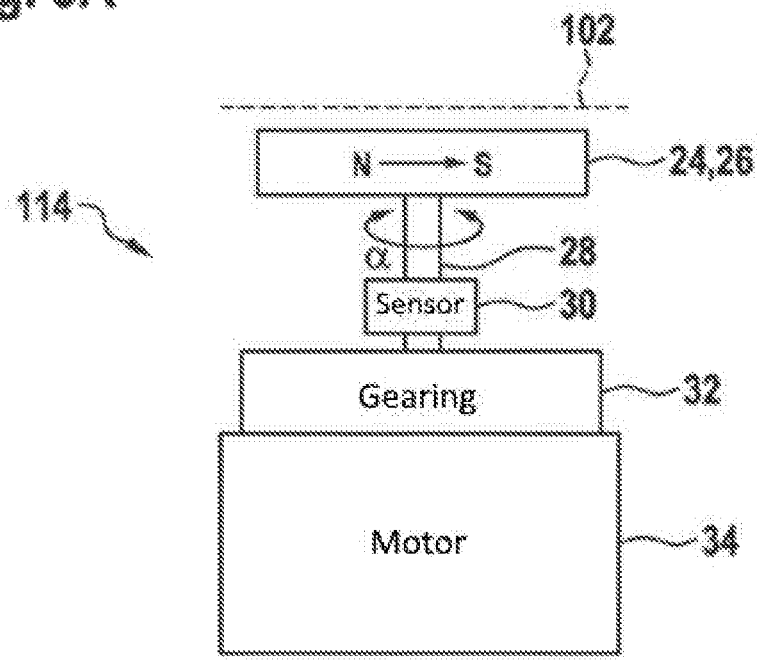
FIGS. 9A and 9B show preferred embodiments of actuating elements in schematic illustrations.
Figure 9B:
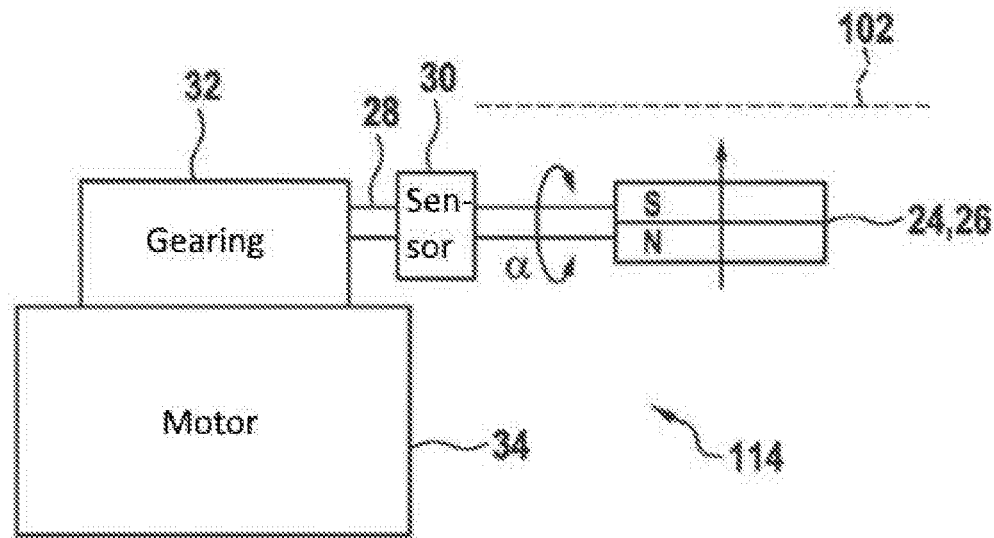

FIGS. 9A and 9B show preferred embodiments of actuating elements 114 in schematic illustrations. These preferably have a drive which has, for example, a motor 34, such as for example an electric motor, which is optionally mechanically connected or coupled via a gearing 32 and the drive shaft 28 to the actuating magnet 26 or the magnet group 24. The actuating element 114 preferably has a sensor 30 for determining the adjustment angle α and optionally a closed-loop controller (not shown) which can set or update the adjustment angle α preferably quickly and precisely to a predefined setpoint position.

For example, an actuating element 114 has an electric motor, on the axle of which at least one magnet group 24 is mounted. The sensor 30 measures the angle of rotation a of the drive shaft, and a closed-loop PID controller with optional downstream drive amplifier preferably activates the motor 34. To increase the torque or the rotational speed, a gearing 32 may be provided between the motor 34 and the drive shaft 28. The gearing 32 may for example be self-locking, such that the motor 34 does not have to be supplied with electrical current in order to maintain a torque in a constant angular position.

The exemplary planar arrangements of similar magnet groups 24 in a regular raster shown in FIGS. 7A to 7E are in this case preferably configured such that each of the magnet groups 24 can be driven or moved by a separate actuating element 114. Here, it is for example possible for the large and small magnet groups 24 illustrated in FIG. 7C to be driven by different actuating elements 114, wherein, for example, large magnet groups 24 are activated by actuating elements 114 with high torque and high inertia (for example with a gearing), whereas small magnet groups 24 are activated by actuating elements 114 with relatively low torque and relatively low inertia. FIG. 7D shows an exemplary arrangement in which the drive shafts 28 run parallel to the active surface 102 and, preferably, each drive shaft 28 drives multiple magnet groups 24.

An actuating element 114 with multiple drives may preferably influence multiple degrees of freedom of a magnet group 24. For example, a magnet group 24 which is cardanically mounted so as to be rotatable in two spatial directions may be rotated by two actuating elements 114 in two different spatial directions.

Instead of electric motors, use may also be made of other drive systems, for example a solenoid or a piezo drive.

To achieve high dynamics, it may be advantageous for the magnet groups 24 to be rotated about one of their main inertial axes with a low moment of inertia. The axis of rotation runs preferably through the center of gravity of the respective magnet group 24 in order to avoid vibrations of the stator 100 owing to imbalance. In order to compensate the inertia of the mechanical drives, it is for example possible, under the active surface 102, for use to additionally be made of coils (see FIGS. 6C and 6D) which, for example with high dynamics, can impart relatively low corrective forces and/or moments to the transport bodies 200. The field of action or levitation field 14 or magnetic field of the stator 100 is then made up of a superposition of the actuating magnet fields and of the coil fields, wherein, although the coil fields may possibly be considerably weaker, they may however be more quickly variable.

Since the drives and the drive amplifiers may warm up during operation, a cooling device may be provided, which cools the drives and/or drive amplifiers for example by heat dissipation via a cooling body or ventilation and suitable ventilation channels in the stator 100 (see for example FIG. 6B).

Figure 9C:
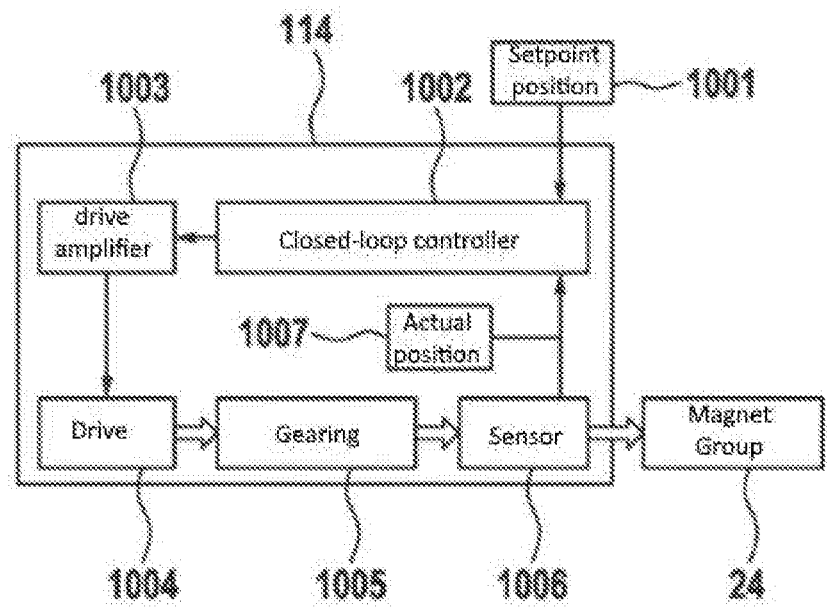
FIG. 9C shows an exemplary functional principle of an actuating element in a block diagram.

FIG. 9C shows, in a block diagram, an exemplary functional principle of an actuating element 114. Here, for example, a setpoint position 1001 of the respective magnet group 24 is transmitted to a closed-loop controller 1002. By means of a drive amplifier 1003, the drive 1004 can then be activated such that the magnet group 24 is correspondingly activated, possibly via a gearing 1005. By means of a corresponding sensor 1006, the actual angular position or the actual position 1007 of the magnet group 24 can be ascertained and fed back to the closed-loop position controller, such that a closed control loop is formed by means of which the most accurate possible positioning and/or orientation of the magnet group can be performed.

Figure 10:
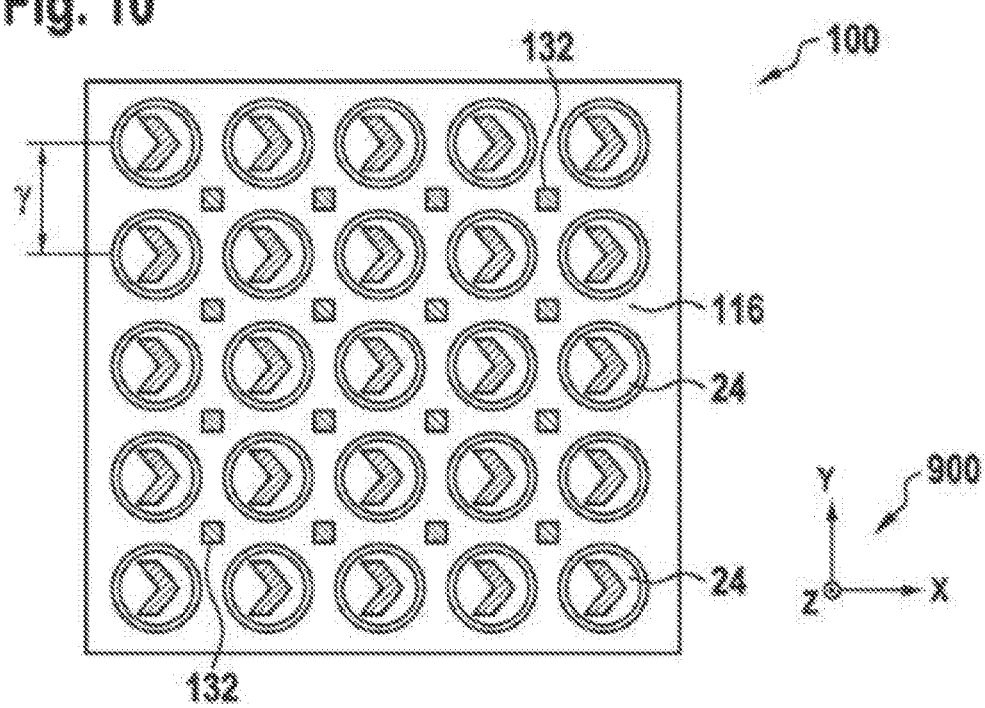
FIG. 10 shows a preferred embodiment of a position determination unit.

In a further preferred embodiment, the conveying device has a position determination unit. This is preferably configured such that the position and/or orientation of the at least one transport body 200 relative to the active surface of the stator 100 can be acquired, preferably cyclically, particularly preferably with a high frequency and short latency time. It is preferable here for all degrees of freedom of the transport body 200 to be acquired. A measurement may for example constitute the basis for the closed-loop control of the transport body position. FIG. 10 shows a preferred embodiment of a position determination unit, which has a transport body position determination element 116. For example, the transport body position determination element 116 may be configured as a circuit board, which preferably has apertures for the magnet groups 24 or the actuating magnets 26 and/or with sensors 132, wherein the sensors 132 are preferably formed as magnetic field sensors.

The position determination unit may be at least partially integrated into the stator 100, or installed spatially separately from the stator 100, and transmit the position data to a closed-loop stator controller. The position determination unit is however preferably integrated in the stator 100, whereby, preferably, a constant dimensional reference with respect to the stator 100 can be ensured and/or the handling of the overall system is simplified. In the case of integration at the stator 100, it is for example also possible for the existing structural space to be utilized in an efficient manner, because the position determination is performed on that side of the transport body 200 which faces toward the stator 100, and the position determination is thus preferably not impeded or falsified by the goods for transport.

As sensors 132, use is preferably made of magnetic field sensors and/or capacitive sensors and/or optical sensors. The sensors are preferably arranged in a regular raster below the active surface 102. For example, Hall sensors may acquire the magnetic field in the transport body 200 at multiple locations and/or in different spatial directions. It is preferable for all sensor signals to be transmitted to a computer system for evaluation. There, for example by means of an algorithm, the actual position of the transport body 200 can be ascertained from the sensor signals and from a description, in the form of a model, of the magnet arrangements in the transport body 200 and stator 100.

To reduce or eliminate the influence of the magnetic fields in the stator 100 on the position determination of the transport body 200, the sensors 132 are preferably installed with the greatest possible spacing to the magnet groups 24 of the stator 100. Additionally, magnetic shielding devices may be provided which weaken the influence of the magnet groups 24 on the sensors 132, which are in the form of magnetic field sensors. For example, in a one-off automatic calibration process in the absence of the transport body, the sensor signal of all of the sensors 132 may be measured as a function of the position of each individual magnet group 24, wherein the measured values can be permanently stored as a corrective table in a memory of the computer system. During operation, it is for example possible for the unprocessed sensor values to be corrected after every measurement by the deficits, stored in the corrective table, of all of the magnet groups, as a function of the present position thereof.

In a further preferred embodiment, an operator control interface in the stator 100 provides basic operator control and display elements for the setup and/or operation and/or servicing and/or maintenance. For example, on/off switches, reset buttons and signal lamps for displaying the operating or fault state of the stator 100 may be provided. More complex setup functions can preferably be performed by a superordinate computer system, which is for example connected to the stator 100 via a communication interface.

Preferably, an electronic controller with at least one computer system acquires the sensor signals, communicates with the superordinate installation, with the operator control interface and possibly with further stators and system components, and activates the actuating elements.

Figure 11:
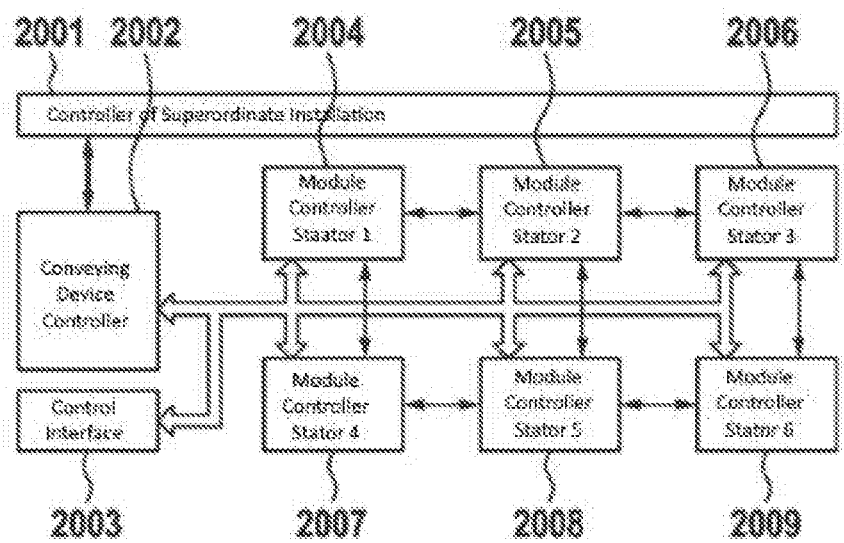
FIG. 11 shows an exemplary control diagram.

A computer system is preferably integrated into each stator 100 or into each stator module. In the case of multiple stators 100 or stator modules being used, the computer systems thereof may for example be networked with bus systems, the topology of which can be expanded in a flexible manner. An exemplary control diagram is illustrated in FIG. 11, which has the following elements:
2001: controller of a superordinate installation
2002: central controller of the conveying device
2003: operator control interface
2004: module controller, stator 1
2005: module controller, stator 2
2006: module controller, stator 3
2007: module controller, stator 4
2008: module controller, stator 5
2009: module controller, stator 6

The bus systems are capable of transmitting large amounts of data in a short time without latency. The bus systems may transmit the data by electrical, optical and/or inductive means. For example, adjacent stators 100 or stator modules may have optical transmitters and receivers by means of which they exchange state information items. Further computer systems may be integrated into the bus systems.

In a preferred embodiment, the method for operating the conveying device 10 may be implemented in the form of algorithms on the at least one computer system. A combination of multiple stators 100 may in this case be treated as a functional unit, such that the control of a transport body 200 is realized independently of whether said transport body is situated in the region of influence of only one stator 100 or of several stators 100. For this purpose, the computer systems are preferably synchronized on a common time basis.

The at least one computer system provides preferably all of the functions required for the setup and/or the reliable operation and/or for the servicing and maintenance of each stator 100 and of a combination of multiple stators 100. For example, integrated self-diagnostics functions may monitor the correct functioning permanently, such that a malfunction can be immediately identified and signaled and/or substitute measures can be implemented, and the system can if necessary automatically perform a safe emergency stop.

A conveying device 10 according to the disclosure has at least one stator 100 or at least one stator module and at least one transport body 200. Here, there are preferably numerous available design parameters which can be influenced for the purposes of adaptation to a target application, for example dimensions of the stator 100 for scaling to the size and/or the weight of the goods for transport, a maximum torque and/or rotational speed and/or moment of inertia of the drives, a strength and/or arrangement of the actuating magnets 26 and static magnets in the stator 100 and/or transport body 200, and closed-loop control parameters.

The arrangement of the magnet groups 24 in the stator 100 is preferably coordinated with the arrangement of the magnet groups 24 in the transport body 200, such that a transport body 200 with f degrees of freedom can, at every point in its working space, be influenced by the forces and moments of at least f magnet groups 24. In particular, the magnet arrangements are configured such that there are no singularities, that is to say no singular regions in the working space in which this condition is not satisfied. Exemplary pairings of magnet arrangements in stator and transport body are as follows:

- stator as per FIG. 7A and transport body as per FIG. 3F, with $\Delta/\lambda=1/3$.
- stator as per FIG. 7A and transport body as per FIG. 3G, with $\Delta/\lambda=1/3$.
- stator as per FIG. 7A and transport body as per FIG. 3I, with $\Delta/\lambda=1/3$.
- stator as per FIG. 7A and transport body as per FIG. 3M, with $\gamma/2r=1/3$.
- stator as per FIG. 7B and transport body as per FIG. 3F, with $\Delta/\lambda=1/3$.
- stator as per FIG. 7E and transport body as per FIG. 3I, with $R/r=1$.

Whereas $\lambda$ denotes the period length of a Halbach arrangement of static magnets 22 or magnet groups 24 of static magnets 22, $\gamma$ denotes a period length of a regular arrangement of actuating magnets 26 or magnet groups 24 (see for example FIG. 7A).

The transport bodies 200 are preferably overdeterminate, that is to say they can be influenced by more than f magnet groups 24 simultaneously. The redundancy thus achieved has advantages, such as for example improved fail safety. If one magnet group 24 is no longer actively controllable, it is preferable for other magnet groups 24 to at least partially compensate for the failure, such that the position of the transport body 200 can be maintained, possibly with limitations. The change in position required for a change in force/moment may preferably be distributed between multiple magnet groups 24. In this way, the change in position for each individual magnet group 24 is preferably reduced. It is thus preferably possible for the change in position to be implemented more quickly overall, such that the dynamics of the conveying device 10 are increased. The forces and moments that must be imparted for the guidance of a transport body 200 are preferably distributed between multiple magnet groups 24, such that smaller magnet groups 24 with weaker actuating elements 114 can be used to achieve the same action. This can yield advantages for energy consumption and the costs of the conveying device 10.

The conveying device may preferably be combined with classic transfer systems. For example, the transport bodies 200 can be transported over large distances by means of a belt, by virtue of said transport bodies for example departing from one stator 100, being moved by a belt to a new position, and moving onto, or being set down onto, a stator again there. In the context of a modular overall system, it is possible for stators 100 with different capabilities to be combined. For example, there may be stator modules which are optimized for high speed and/or high precision and/or high forces. These modules are preferably used in regions where they are required.

Figure 12A:
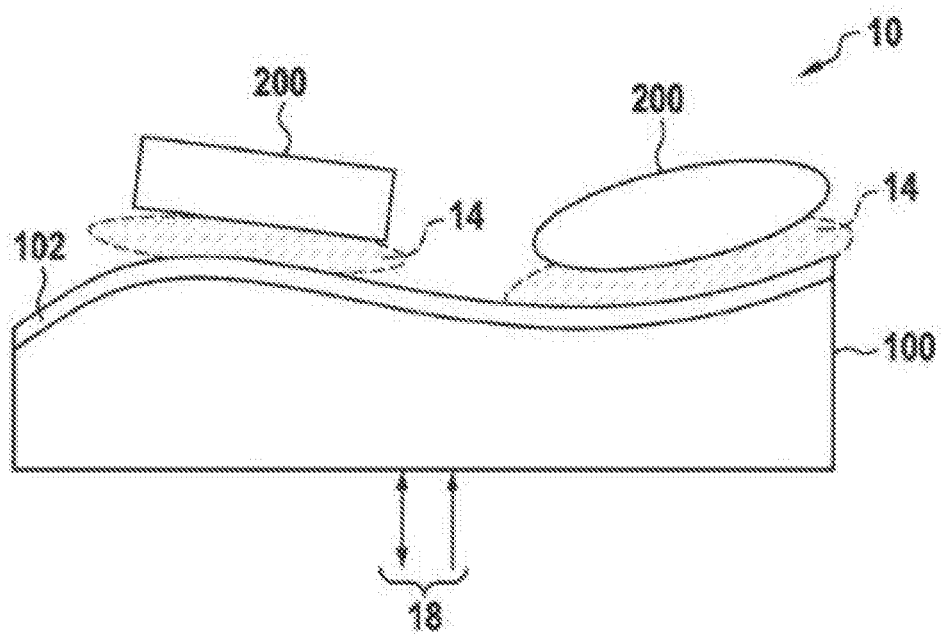
FIGS. 12A to 12C show preferred embodiments of conveying devices.
Figure 12B:
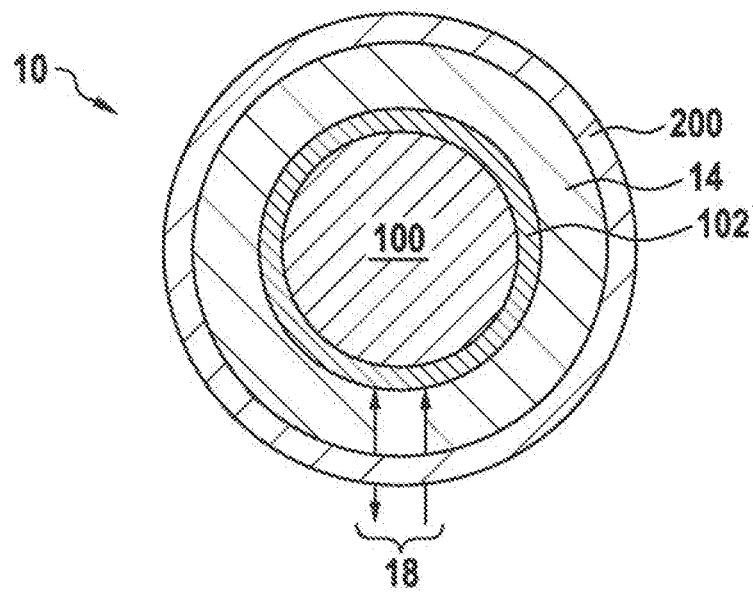
Figure 12C:
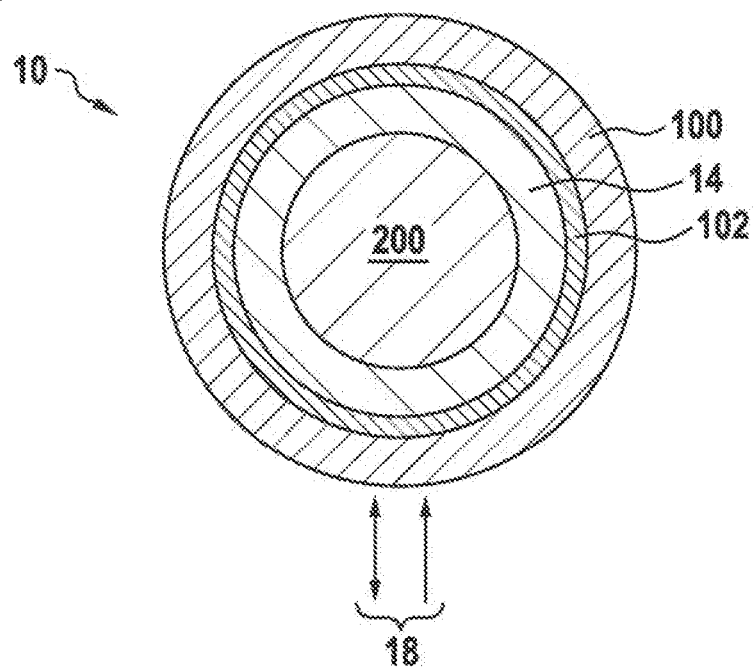

Even stators with curved surfaces, as illustrated in FIG. 12A, may be realized by means of corresponding arrangement of the magnet groups, for example in a circular structural form as illustrated in FIGS. 12B and 12C, which have an externally or internally guided transport body 200 and an internally or externally situated stator 100 respectively. For example, such conveying devices may be advantageous for use as a mechanical bearing, for example for the rotatable mounting about a shaft.

To save energy, the actuating elements 114 may preferably be temporarily operated with reduced electrical current, or deactivated, for as long as no transport body 200 is situated in the catchment region of the respective magnet assembly 24. They are preferably activated again within a short time when a transport body 200 approaches.

The outer surfaces of stator 100 and transport body 200 may preferably be configured so as to be adapted to the respective environmental conditions, for example to extreme temperature requirements, high cleanliness requirements, freedom from particles, sterility, ease of cleaning, resistance to aggressive materials, use in explosive areas, use in liquid or gas atmosphere etc. For this purpose, there is for example a broad palette of non-ferromagnetic materials, such as non-ferrous metals, plastic, Teflon, ceramic, glass, rubber, wood and many others.

A group of transport bodies 200 may preferably jointly perform a task. For example, multiple transport bodies 200 moved in synchronized fashion can transport a large load which is too heavy for one transport body 200. Alternatively, multiple transport bodies 200 are connected to one another for example by means of a passive kinematic bar mechanism and joints, such that the kinematics can be used as a handling apparatus.

Not all degrees of freedom necessarily have to be implemented in levitation; rather, individual degrees of freedom may also be realized by means of a mechanical guide.

For inexpensive realization of a levitating system with a large transport range, the stator 100 may preferably be combined with classic axle systems or vehicles as a movement device. For example, an axle system or a vehicle with wheels transports a stator 100 over a large working region, whereas the stator 100 itself can position a transport body 200 in precise and floating fashion in a small working region.

Optionally, there is an intermediate plane (particle barrier) situated between stator 100 and transport body 200. Here, the transport body 200 may preferably be situated in the clean region, whereas the vehicle is situated outside said clean region. The locomotion function is for example performed primarily by the vehicle with its classic wheel-type drive, and the levitation function and precise positioning by the stator 100 with transport body 200.

Figure 13:
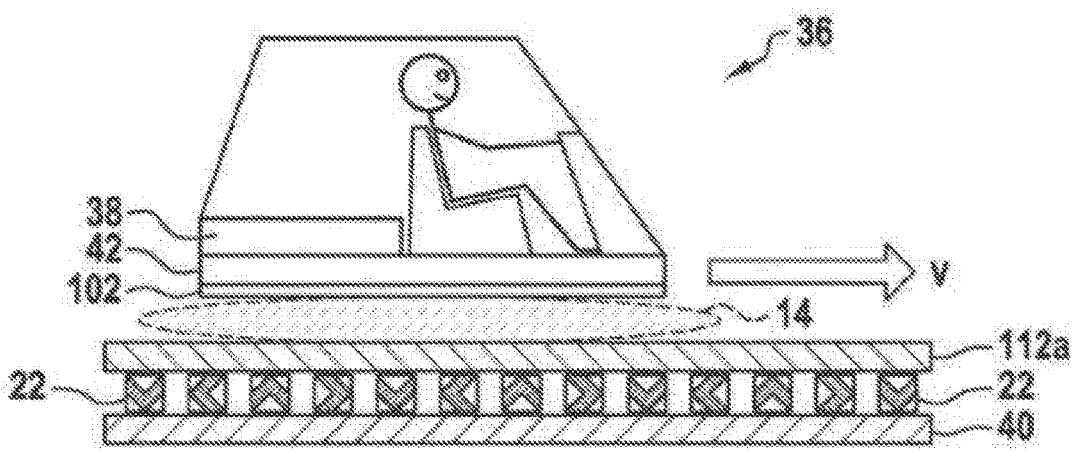
FIG. 13 shows a preferred embodiment of a vehicle.

The operating principles of stator 100 and transport body 200 may, in other preferred embodiments, be interchanged, such that, for example, an arrangement of static magnets is situated in the stator 100 and actively moved actuating magnets 26 are situated in the transport body 200. In this variant, it is for example possible for the transport body 200 to carry the energy supply 38 on-board (for example battery, fuel cell, solar cells) or to be supplied with energy from an external source (for example via a cable). In this way, it is for example possible for locomotion of a vehicle 36 to be realized by means of active drive and without wheels by virtue of said vehicle having a drive 42 with actuating magnets 26, in order to travel for example on a rail or plane which is fastened to the ground 40 and which is equipped with static magnets 22 (see FIG. 13).

Below, on the basis of the above-described conveying device 10, a method according to a preferred embodiment with which the stable magnetic levitation of at least one transport body 200 is achieved will be described, but without the disclosure being restricted to the method discussed.

The at least one transport body 200 is subjected to forces and moments in a dynamically varying magnetic field, which is generated by means of the movement, controlled in closed-loop fashion, of actuating magnets 26 in at least one stator 100.

For the description of the position of the at least one transport body 200, the Cartesian coordinate systems 900 and 920 are established:

Each transport body i has a coordinate system 920i with the axes (x, y, $z_i$) and with a positionally fixed reference with respect to the transport body; the origin of said coordinate system lies for example in the calculated center of mass of the magnet arrangement of the transport body.

The stator coordinate system 900 with the axes (X, Y, Z) has a positionally fixed reference with respect to the stator. Its X and Y axes lie in the active surface of the stator, and the Z axis is perpendicular to the active surface and points in the direction of the transport body. The position of the transport body with the index i is described in the stator coordinate system by the position vector 4, which indicates the origin of the transport body coordinate system. The angular position of the transport body i is expressed by the vector $\vec{\varphi}_i$, the three components of which indicate the angles enclosed by the X, Y and Z axes of the coordinate systems of stator and transport body.

Also provided is an arrangement of magnet groups in the stator, which are individually movable in at least one dimension relative to the stator and the position of which can be varied by means of actuating elements. Below, it will be assumed that the rotational position or angular position of the magnet group is variable, wherein the axis of rotation is constant in the stator coordinate system and runs through the center of mass of the magnet group. The present rotational position of the magnet group k is $\alpha_k$. The controller predefines the setpoint angle $\alpha_{k,soll}$, which is implemented in a quick and precise manner by the closed-loop control of the actuating element, such that, after a short time, $\alpha_k = \alpha_{k,soll}$.

Figure 14:
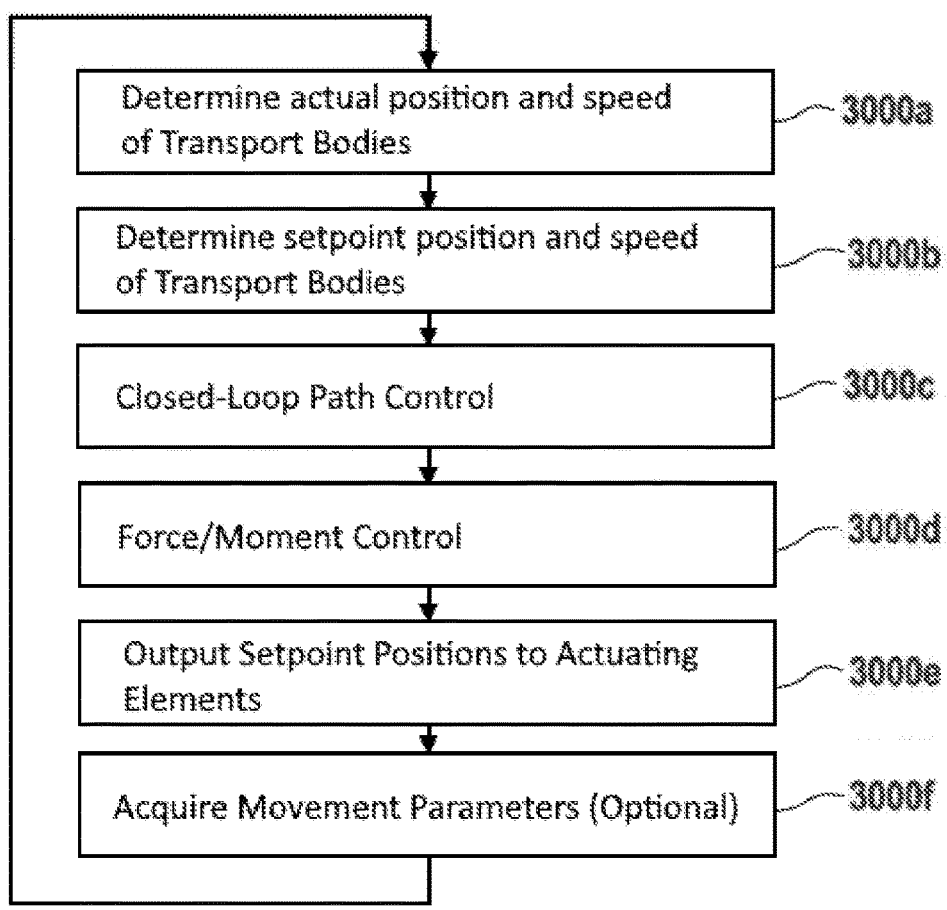
FIG. 14 shows an exemplary method sequence diagram.

According to the preferred embodiment, the method is implemented as a program in the controller and is run through cyclically with a frequency of 100-10 000 Hz. The functional steps of an exemplary loop run, as illustrated by way of example in FIG. 14, will be described below.

3000a) Determination of the Actual Position and of the Actual Speed of the Transport Bodies Magnetic field sensors, capacitive sensors and/or optical sensors are attached in a regular raster below the active surface of the stator. The following description is based for example on Hall sensors. Each Hall sensor measures three magnetic field components in orthogonal directions. The unprocessed sensor values are read in by a computer, along with the angular position of all of the magnet groups in the stator. If further stators are adjacent, the measured values ascertained there at the same time are transmitted via a data bus to the stator. The entire reading-in process typically lasts between 0.1 ms-1 ms.

Firstly, the measured values of each sensor are corrected by the influence of the magnet groups adjacent thereto. The field contributions of the adjacent magnet groups have been determined in a one-off manner for each sensor in an initialization run and have been stored, as a function of rotation angle, in corrective tables. Using the presently read-in rotational angle of the adjacent magnet groups, the corrective tables are accessed. The field contributions of the adjacent magnet groups are subtracted from all unprocessed sensor values. The corrected sensor values thus obtained represent the flux density of the transport body magnet arrangement over the active surface.

Subsequently, the position of the at least one transport body is ascertained. For this purpose, a description of the magnet arrangement of the transport bodies is stored as a list in the memory of the computer. The list includes the positions and dipole vectors of all actuating magnets and/or magnet groups 24, specified in the transport body coordinate system. By means of this list, the field equation for a magnetic dipole and the superposition principle, a mathematical model of the flux density distribution of the transport body is established. With the model, it is possible to calculate the flux density vectors which are to be expected at a predefined transport body position at the location of the stator sensors. A scalar error function ascertains a value for the mismatch of the measured and modeled flux densities of all transport bodies and magnet groups. By iterative optimization of the position and angular position of the transport bodies in the model, the error function is minimized, that is to say is adapted to the real measured data. The iteration process is ended as soon as no further improvement is attained and/or a predefined error threshold is undershot.

The thus determined 6D position of the at least one transport body i is, in the context of the accuracy of the model, interpreted as a real position of the transport body i with the position vector $\vec{r}_i$ and the angle vector $\vec{\varphi}_i$. By numerical differentiation of the cyclic sequence of position values, the actual speed with the speed vector $\vec{v}_{i,soll}$ for the translation and the angular speed vector $\vec{\omega}_{i,soll}$ for the rotation is calculated.

3000b) Determination of the Setpoint Position and Setpoint Speed of the Transport Bodies A superordinate installation can communicate to the controller the desired movement path of the at least one transport body as a sequence of 6D setpoint positions, setpoint times and/or setpoint speeds. The path may be composed of straight lines, circular portions or other geometrical basic elements.

The controller spatially and temporally interpolates the movement path. For the spatial interpolation, use may be made of various interpolation methods which are common in the field of robotics, for example linear, spline or polynomial interpretation. For the temporal interpolation, the controller breaks down the spatially interpolated path into interpolation points. In each cycle, said controller provides, for each transport body i, the setpoint position with the position vector $\vec{r}_{i,soll}$ and the angle vector $\vec{\varphi}_{i,soll}$, and optionally the setpoint speed with the speed vector $\vec{v}_{i,soll}$ for the translation and the angular speed vector $\vec{\omega}_{i,soll}$ for the rotation, and transmits these to the closed-loop path controller.

3000c) Closed-Loop Path Control

The closed-loop path control serves for updating the actual position of the transport body quickly and precisely to the setpoint position. For this purpose, the closed-loop path controller calculates the control error, that is to say the difference between setpoint and actual position and/or setpoint and actual speed in all 6 dimensions. The closed-loop path controller uses this as an input variable for a closed-loop control algorithm, for example the PID algorithm, which is calculated separately for each dimension for which closed-loop control is to be performed. As an output variable, the closed-loop path controller provides, for each transport body i, the setpoint force vector $\vec{F}_{i,soll}$ and the setpoint moment vector $\vec{M}_{i,soll}$ which is required for correcting the path. The closed-loop control parameter such as gain (P), reset time (I) and derivative time (D) are either ascertained in one-off fashion and stored as fixed values in the controller, or are dynamically adapted to the movement and loading state of the transport body, for example to the total mass thereof or to the mass distribution, which can be ascertained by means of an observer or an observation device (see 3000f)).

3000d) Force/Moment Control

From the setpoint force vectors and the setpoint moment vectors for all transport bodies, this program part calculates the setpoint positions for all magnet groups that lead to the generation of the setpoint forces and moments. All magnet groups which have an influence on the transport body to be controlled are incorporated. For this purpose, the force/moment controller uses a spatial model of the magnet arrangement in the stator and in the at least one transport body. The model is capable of approximately calculating the forces and moments that take effect at a predefined position of the magnet groups. In the model, the magnet arrangements of the transport bodies are stored as a list of the positions and dipole vectors of all of the transport body magnets. A list of the magnets of each magnet group is likewise stored. In the model, firstly the partial forces and moments between all of the magnet pairs are calculated, and subsequently, from this, the overall force acting on each transport body and the overall moment are calculated. Here, all influences are taken into consideration in the best possible manner, for example also the forces and moments mutually exerted between two transport bodies.

For the calculation, substantially the following equations are used:

Magnetic field $\vec{B}$ of a magnetic dipole $\mu$ at location $\vec{r}$:

$$\vec{B}(\vec{r}) = \frac{\mu_0}{4\pi} \frac{3\vec{r}(\vec{\mu}\vec{r}) - \vec{\mu}r^2}{r^5}$$

where $r=|\vec{r}|$, where $\mu_0$ is the magnetic field constant.

Magnetic field $\vec{B}_{ges}$, as a superposition of the fields $\vec{B}_i$ (superposition principle)

$$\vec{B}_{ges}(\vec{r}) = \sum_{i=1}^{n} \vec{B}_i(\vec{r})$$

where n represents the number of superposed fields.

Force $\vec{F}$ on a magnetic dipole $\mu$ in the field $\vec{B}$:

$$\vec{F} = \vec{\Box}(\vec{\mu}\vec{B})$$

The torque $\vec{M}$ that acts on a magnetic dipole $\vec{\mu}$ in the field $\vec{B}$:

The additional torque $\vec{M}_F$ owing to forces $\vec{F}_i$ that act with a spacing $\vec{r}_i$ to the center of gravity, wherein represents the number of forces:

$$\vec{M}_F = \sum_{i=1}^{n} \vec{r}_i \times \vec{F}_i$$

Incorporating the actual position of all actuating elements and transport bodies, in the model, the actual force vector $\vec{F}_i$ and the actual moment vector $\vec{M}_i$. A presently acting on each transport body i are calculated. The error adaptation between the actual and setpoint forces and between the actual and setpoint moments of all transport bodies is evaluated by means of a scalar error function E:

$$E = \sum_{i=1}^{m} \left( \left( \frac{|\vec{F}_{i,soll} - \vec{F}_i|}{F_0} \right)^2 + \left( \frac{|\vec{M}_{i,soll} - \vec{M}_i|}{M_0} \right)^2 \right)$$

where m represents the number of transport bodies, $\vec{F}_i$ and $\vec{M}_i$ represent the actual force and the actual moment, $\vec{F}_{i,soll}$ and $\vec{M}_{i,soll}$ represent the setpoint force and the setpoint moment, and $F_0$ and $M_0$ represent the reference force and the reference moment.

The smaller the value of E, the better the correspondence between the actual and setpoint forces and moments of all transport bodies. The error function may be modified or may be expanded to include additional terms, such that configurations which are more expedient in terms of energy are preferred. It is thus possible for the characteristics of the overall system to be optimized, for example, for minimum power requirement, minimal change in position of the magnet groups or minimum number of magnet groups involved in a change in position.

In an iterative optimization process, the positions of the magnet groups are varied in stepwise fashion in the model. After every step, the forces and moments are recalculated in the model and are evaluated by means of the error function. Steps which lead to a reduction of the error E are maintained and form the basis for the next iteration step. As soon as the error can be reduced no further and/or a preset threshold has been undershot and/or a predefined number of iteration steps has been performed, the optimization loop is ended.

3000e) Outputting of the Setpoint Positions to the Actuating Elements

The positions of the magnet groups optimized in the model are output as a setpoint specification to the actuating elements.

3000f) Observer for the Ascertainment of the Movement Parameters (Optional)

An algorithm referred to as an "observer" acquires the profile with respect to time of the actual position of the magnet groups and of the transport bodies in reaction thereto. Said algorithm utilizes these information items to determine the movement parameters of the transport bodies with the aid of an expanded model. The expanded model is based on the force/moment model described above, and is supplemented by further physical variables which describe the movement state of the transport body, for example mass, damping, center of gravity, center of gravity vector, inertia tensor or inertial acceleration. Additionally calculated in the model are the movement equations of the transport bodies, both in translation and in rotation.

Since the movement parameters are not known a priori, its value is initially estimated and is subsequently optimized in an iterative calculation of the model by means of targeted parameter variation. For the evaluation of the mismatch, a scalar function is used which evaluates the deviation of the modeled trajectory from the measured trajectory over the duration of the most recent measurements.

As a result, approximate values for the above-stated movement parameters are made available. These may be used for example within the open-loop control for the optimization of the closed-loop control parameters such as P, I and D. For example, the total weight m of the transport body with payload may be ascertained and, in the closed-loop path control, incorporated as a factor into the calculation of the setpoint forces and moments, such that, in the case of a doubled weight, doubled forces and moments are output to the transport body and thus the acceleration a=F/m is independent of the mass. The movement parameters may also be output as state information to the superordinate installation (FIG. 16), such that this can for example infer the loading state from the weight of the transport body and thus perform process control. For example, the conveying device may have a loading detection device for the detection of a loading state or of the total mass of the transport body. In another example, a shift of a center of gravity, for example during the transport of a sloshing liquid, can be actively compensated, such that open containers with liquid can be transported quickly and reliably in terms of a process.

The invention claimed is:

1. A conveying device comprising:
   a stator; and
   at least one transport body, the conveying device configured to convey the at least one transport body relative to the stator in a controlled manner, wherein:
   one of the stator and the at least one transport body comprises multiple movably arranged actuating magnets, each actuating magnet connected by an actuating element to the one of the stator and the at least one transport body, wherein the actuating element is configured to vary a position and/or an orientation of the actuating magnet connected thereto relative to the one of the stator and the at least one transport body in a controlled manner,
   the other of the stator and the at least one transport body comprises at least two static magnets connected to the other of the stator and the at least one transport body such that the at least two static magnets are immovable relative to the other of the stator and the at least one transport body,
   the stator and the at least one transport body are magnetically coupled by the at least two static magnets and the multiple actuating magnets,
   the controlled position and/or orientation of the actuating magnets via the actuating elements is used to levitate and stabilize the at least one transport body with respect to the stator, and to propel the at least one transport body in different directions with respect to the stator depending on the controlled position and/or orientation of the actuating magnets,
   the stator includes a conveying surface, and
   the actuating elements are configured to rotate the actuating magnets about axes that are perpendicular to the conveying surface.

2. The conveying device as claimed in claim 1, wherein the at least two static magnets include:
   exactly two static magnets arranged on a straight line, wherein a dipole moment of at least one of the two static magnets is oriented non-parallel with respect to said straight line, or
   three or more static magnets.

3. The conveying device as claimed in claim 1, wherein the multiple actuating magnets and/or the at least two static magnets are arranged so as to face toward a conveying surface, wherein the conveying device is configured to convey the at least one transport body relative to the stator along the conveying surface in a controlled manner.

4. The conveying device as claimed in claim 1, wherein each of the at least two static magnets and/or each of the multiple actuating magnets have at least one permanent magnet.

5. The conveying device as claimed in claim 4, wherein the at least one permanent magnet has a magnetic flux density of at least 0.05 T.

6. The conveying device as claimed in claim 1, wherein the multiple actuating magnets have in each case one magnet group; and/or the at least two static magnets are arranged in a magnet group, and wherein each magnet group has a multiplicity of permanent magnets and/or magnet coils.

7. The conveying device as claimed in claim 6, wherein the multiplicity of permanent magnets and/or magnet coils of the magnet group are arranged in at least one Halbach array such that a magnetic field of the magnet group extends toward the conveying surface.

8. The conveying device as claimed in claim 1, wherein each actuating element has includes at least one of:
   a drive element configured to vary the position and/or the orientation of the associated actuating magnet in a controlled manner;
   a sensor element configured to ascertain the position and/or the orientation of the associated actuating magnet; and
   a control element which is configured to set the position and/or the orientation of the associated actuating magnet to a predetermined value by means of the drive element.

9. The conveying device as claimed in claim 1, wherein the conveying device is configured to levitate the at least one transport body relative to the stator via the multiple actuating magnets and the at least two static magnets.

10. The conveying device as claimed in claim 1, further comprising at least one of:
    a position determination unit configured to ascertain a relative position and/or orientation of the at least one transport body relative to the stator;
    a movement device which is configured to move the stator relative to an environment;
    a loading detection device configured to ascertain a loading state of the transport body; and
    an observation device which is configured to ascertain a mass and/or a center of gravity of the transport body relative to the stator.

11. The conveying device as claimed in claim 1, wherein the transport body or the stator has an energy store and is formed as a vehicle.

12. The conveying device as claimed in claim 1, wherein the at least one transport body has at least one internal degree of freedom.

13. The conveying device as claimed in claim 1, wherein at least one of the stator and the transport body includes a cover configured to limit forces acting between the stator and the transport body.

14. The conveying device as claimed in claim 1, wherein:
    the static magnets are arranged as a two-dimensional Halbach array and have a rectangular and/or square and/or hexagonal and/or circular arrangement, or
    the static magnets are arranged in the transport body at least partially in a cylindrical and/or spherical manner.

15. The conveying device as claimed in claim 1, wherein the at least one transport body has an identification element, and the conveying device is configured to identify the transport body based on the identification element.

16. The conveying device as claimed in claim 1, wherein:
- the stator has multiple stator modules arranged adjacent to one another; and/or
- the actuating elements are formed as rotary actuators which have in particular an axis of rotation perpendicular to an active surface of the stator; and/or
- the stator has a curved active surface; and/or
- the conveying device is formed as a contactless mechanical bearing; and/or
- the conveying device is configured to fix the at least one transport body to the at least one stator in the event of an interruption in a power supply.

17. The conveying device as claimed in claim 1, wherein a number of degrees of freedom of the actuating magnets is at least as great as a number of degrees of freedom along which the at least one transport body is conveyed and/or positioned in a controlled manner.

18. A method for operating a conveying device that comprises a stator and at least one transport body, wherein one of the stator and the at least one transport body comprises multiple movably arranged actuating magnets, each actuating magnet connected by an actuating element to the one of the stator and the at least one transport body, wherein the actuating element is configured to vary a position and/or an orientation of the actuating magnet connected thereto relative to the one of the stator and the at least one transport body in a controlled manner, wherein the other of the stator and the at least one transport body comprises at least two static magnets connected to the other of the stator and the at least one transport body such that the at least two static magnets are immovable relative to the other of the stator and the at least one transport body, wherein the stator and the at least one transport body are magnetically coupled by the at least two static magnets and the multiple actuating magnets, and the conveying device is configured to convey the at least one transport body relative to the stator by at least one of controlled positioning and controlled orientation of the multiple actuating magnets via the actuating elements, the method comprising:
- activating the actuating elements by at least one of controlled positioning and controlled orientation of the multiple actuating magnets via the actuating elements to levitate and stabilize the at least one transport body with respect to the stator; and
- activating the actuating elements to position and or orient the multiple actuating magnets to propel the at least one transport body in at least one direction with respect to the stator,
- wherein the stator includes a conveying surface, and
- wherein the actuating elements are configured to rotate the actuating magnets about axes that are perpendicular to the conveying surface.

19. The method as claimed in claim 18, wherein the at least one of the desired position the desired orientation has six degrees of freedom.

20. The method as claimed in claim 18, wherein the activating of the actuating elements comprises:
- determining at least one of an actual position and an actual speed of the transport body relative to the stator;
- determining at least one of a setpoint position and a setpoint speed of the transport body relative to the stator;
- ascertaining a deviation of the at least one of the actual position and the actual speed from the at least one of the setpoint position and the setpoint speed;
- calculating setpoint positions over at least some of the actuating magnets such that the respective actuating magnets act so as to reduce the ascertained deviation; and
- arranging the respective actuating magnets using the actuating elements such that the respective actuating magnets assume the setpoint positions.

* * * * *